(12) United States Patent
Kuan et al.

(10) Patent No.: US 8,236,658 B2
(45) Date of Patent: Aug. 7, 2012

(54) METHODS FOR FORMING A TRANSISTOR WITH A STRAINED CHANNEL

(75) Inventors: Ta-Ming Kuan, Zhongli (TW); Chih-Hsin Ko, Fongshan (TW); Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 251 days.

(21) Appl. No.: 12/477,757

(22) Filed: Jun. 3, 2009

(65) Prior Publication Data
US 2010/0308379 A1 Dec. 9, 2010

(51) Int. Cl.
*H01L 21/336* (2006.01)
(52) U.S. Cl. .............. 438/299; 257/E21.431
(58) Field of Classification Search .......... 257/408, 257/344, 616, E21.431; 438/299, E21.431
See application file for complete search history.

(56) References Cited

U.S. PATENT DOCUMENTS

| | | | |
|---|---|---|---|
| 6,518,109 B2 * | 2/2003 | Roberds | 438/197 |
| 7,923,346 B2 * | 4/2011 | Curatola et al. | 438/427 |

OTHER PUBLICATIONS

Malgorzata Jurczak et al., "Dielectric Pockets—A New Concept of the Junctions for Deca-Nanometric CMOS Devices", IEEE Transactions on Electron Devices, vol. 48, No. 8, Aug. 2001, 0018-9383/01, 5 pages.

Y. S. Kim et al., "Suppression of Defect Formation and Their Impact on Short Channel Effects and Drivability of pMOSFET with SiGe Source/Drain", Fujitsu Laboratories, Ltd., 1-4244-0439-8/06, 2006 IEEE, 4 pages, 2006.

K. Sawano et al., "Relaxation Enhancement of SiGe Thin Layers by Ion Implantation into Si Substrates", Department of Applied Physics, School of Engineering, The University of Tokyo, 0-7803-7581-5/02, 2002 IEEE, pp. 403-404, 2002.

* cited by examiner

Primary Examiner — Mark Prenty
(74) Attorney, Agent, or Firm — Haynes and Boone, LLP

(57) ABSTRACT

A semiconductor device and method for fabricating a semiconductor device providing reduced short channel effects is disclosed. The method comprises providing a substrate comprising a first material; forming at least one gate stack over the substrate; forming one or more recesses in the substrate, wherein the one or more recesses define at least one source region and at least one drain region; and forming a pocket, a first layer comprising a second material, and a second layer comprising a third material in the one or more recesses, the pocket being disposed between the first layer and the substrate.

21 Claims, 18 Drawing Sheets

METHODS FOR FORMING A TRANSISTOR WITH A STRAINED CHANNEL

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. One example of an IC device that has experienced such scaling down is a transistor (e.g., a metal-oxide-semiconductor field-effect-transistor (MOSFET)). To enhance performance of transistors, strain is often introduced into the transistor channel for improving mobility enhancement. Strain may be introduced by having an IC device comprising a silicon substrate and SiGe source/drain regions. The SiGe source/drain regions introduce strain into a silicon channel. Typically, the SiGe source/drain regions are formed in the silicon substrate, and then, the device is subjected to one or more implantation processes. It has been observed that the subsequent implantation processes cause relaxation of the SiGe induced stress. Further, defects arising at the substrate/SiGe source/drain region interface increase short channel effects by enhancing diffusion.

Accordingly, what is needed are semiconductor devices that address the above stated issues, and methods for making such integrated circuit devices.

SUMMARY

A semiconductor device and method for fabricating the same is provided. In one embodiment, the method includes providing a substrate comprising a first material; forming at least one gate stack over the substrate; forming one or more recesses in the substrate, wherein the one or more recesses define at least one source region and at least one drain region; and forming a pocket, a first layer comprising a second material, and a second layer comprising a third material in the one or more recesses, the pocket being disposed between the first layer and the substrate.

In one embodiment, the method includes providing a substrate having at least one gate stack disposed thereover; performing one or more implantation processes on the substrate; forming a set of spacers adjacent the at least one gate stack; forming one or more recesses in the substrate, wherein the one or more recesses define at least one source region and at least one drain region; forming a pocket in the one or more recesses, wherein the pocket is substantially aligned with a spacer; forming a first layer to partially fill the one or more recesses, wherein the first layer is adjacent the pocket in the one or more recesses; and forming a second layer over the first layer and the pocket in the one or more recesses, wherein the second layer partially fills the one or more recesses.

In one embodiment, the semiconductor device includes a substrate having at least one strained channel region disposed between a source region and a drain region; at least one gate structure disposed over the at least one strained channel region, the at least one gate structure comprising a gate stack and a set of gate spacers adjacent the gate stack; wherein the source region and the drain region comprise a pocket, a first layer, and a second layer, the pocket being disposed between the first layer and the at least one strained channel region of the substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
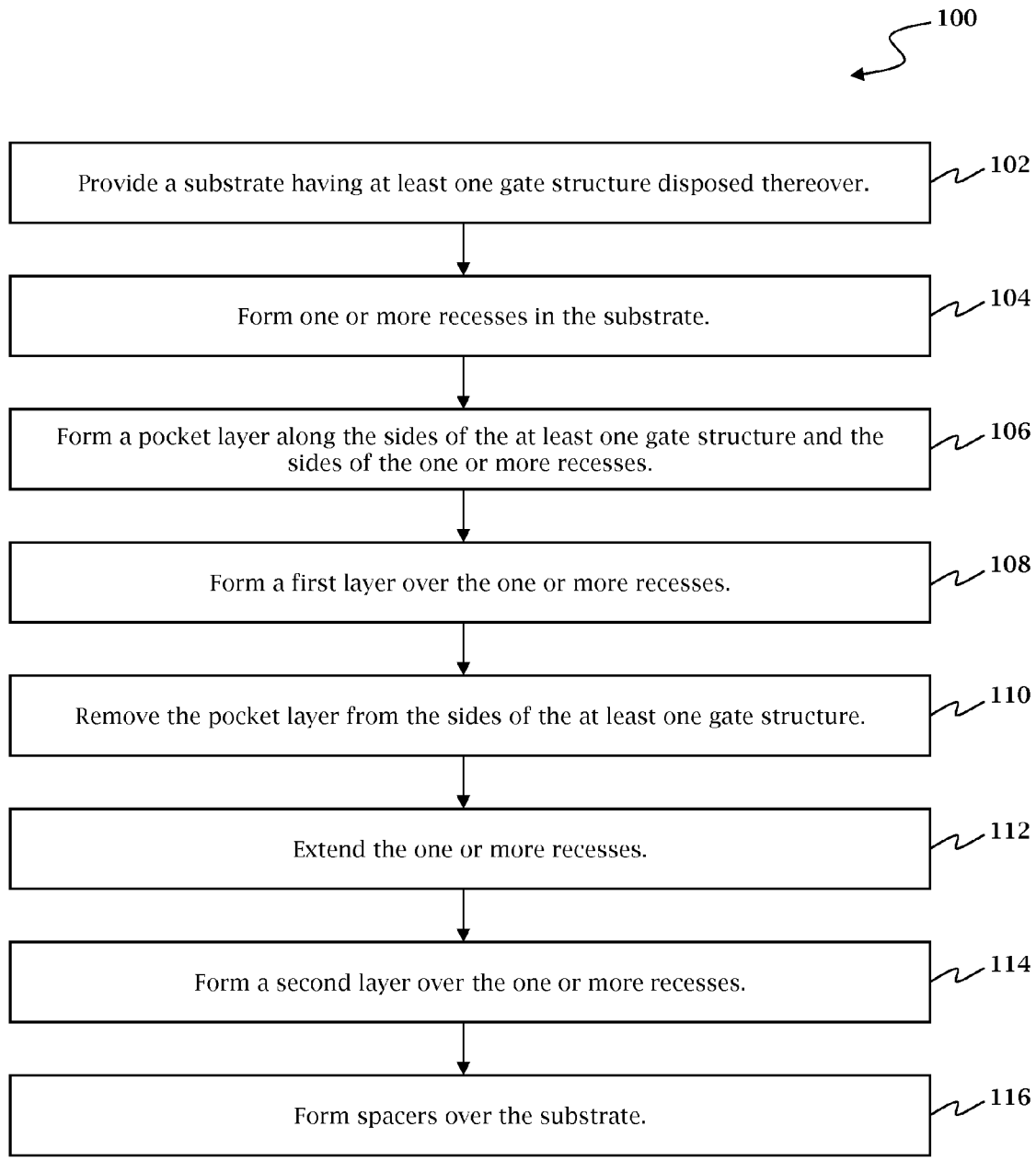
FIG. 1 is a flow chart of a method for fabricating a semiconductor device according to aspects of the present embodiments.

The present disclosure relates generally to methods for manufacturing semiconductor devices, and more particularly, to a method for manufacturing a semiconductor device with improved device performance and/or improved control of short channel effects.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
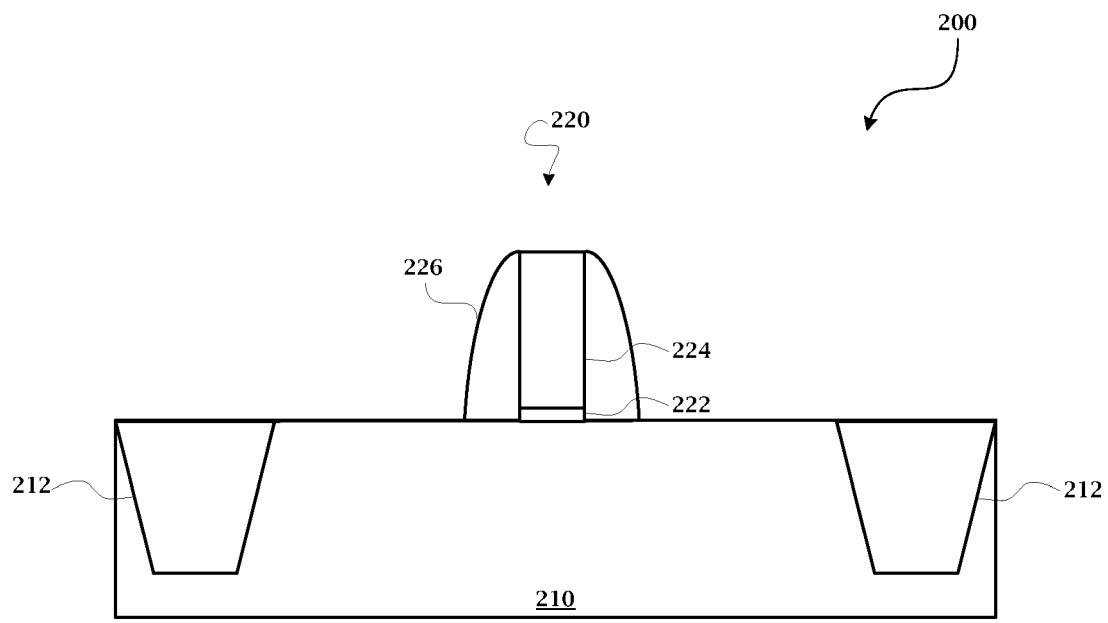
FIGS. 2A-2G are various cross-sectional views of embodiments of a semiconductor device during various fabrication stages according to the method of FIG. 1.
Figure 2B:
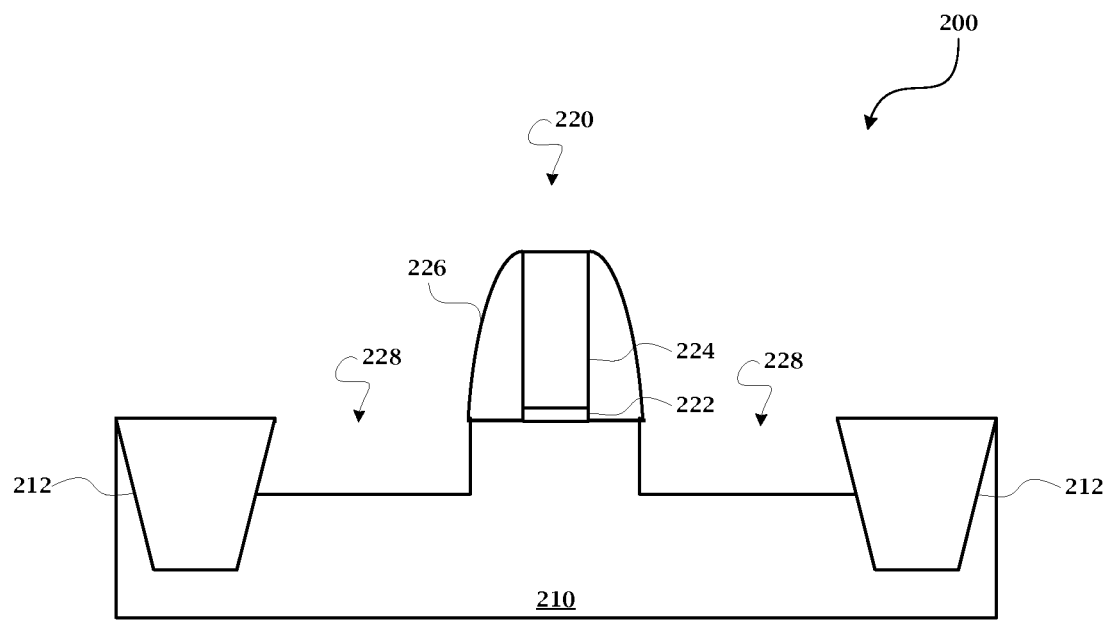
Figure 2C:
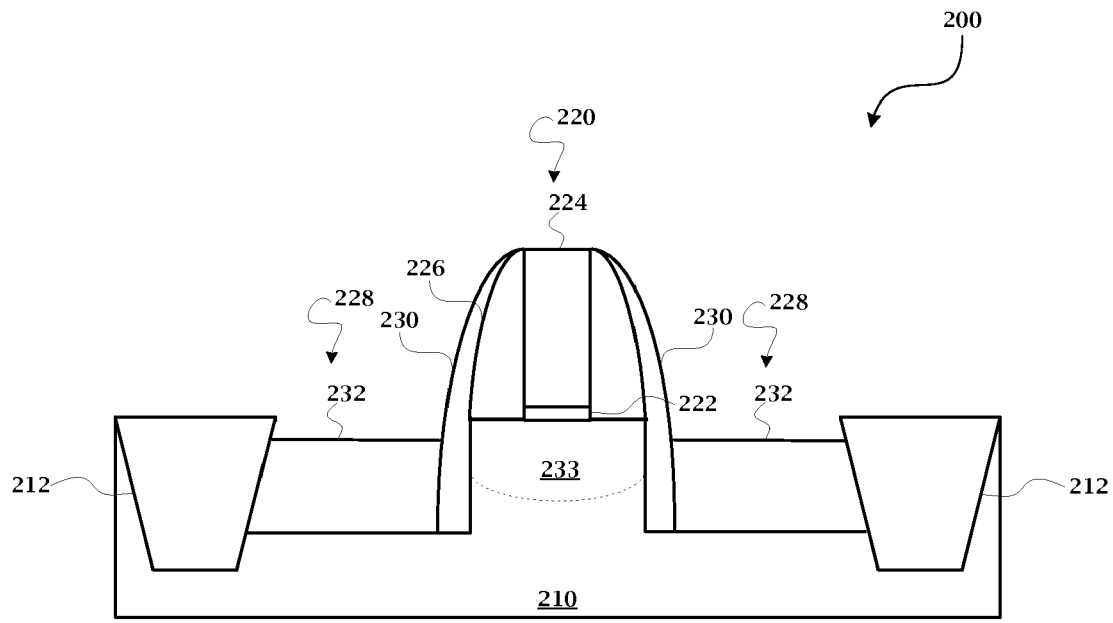
Figure 2D:
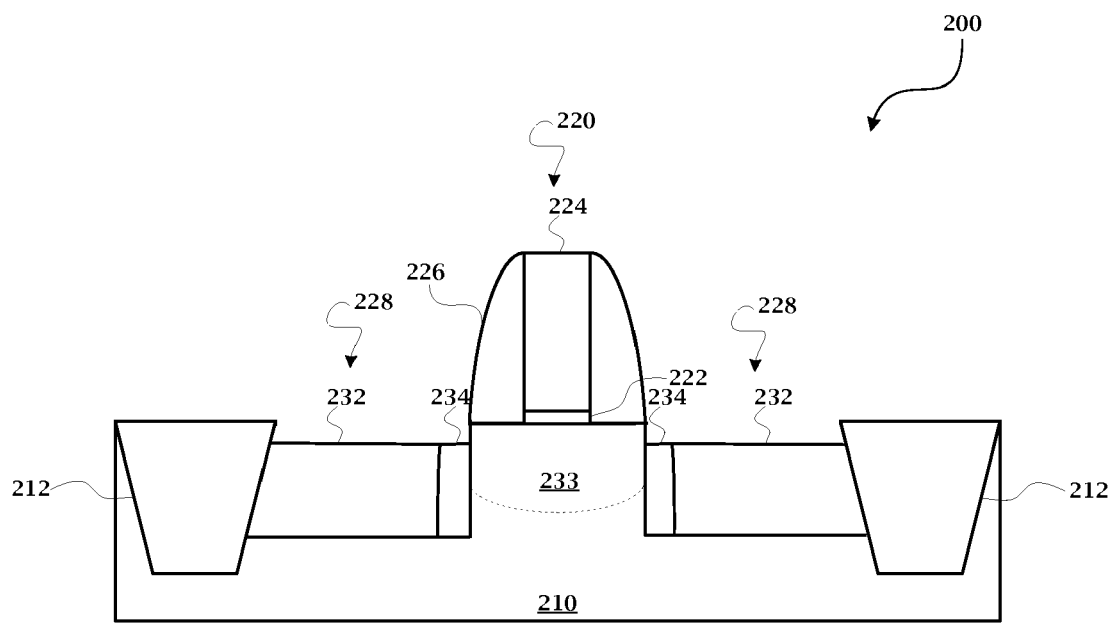
Figure 2E:
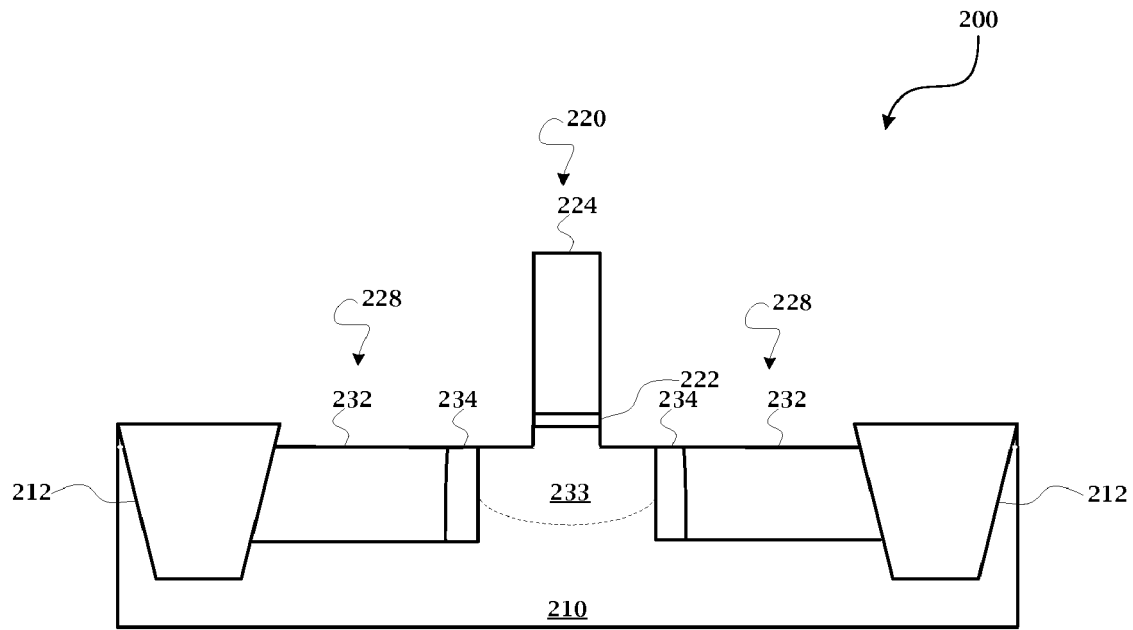
Figure 2F:
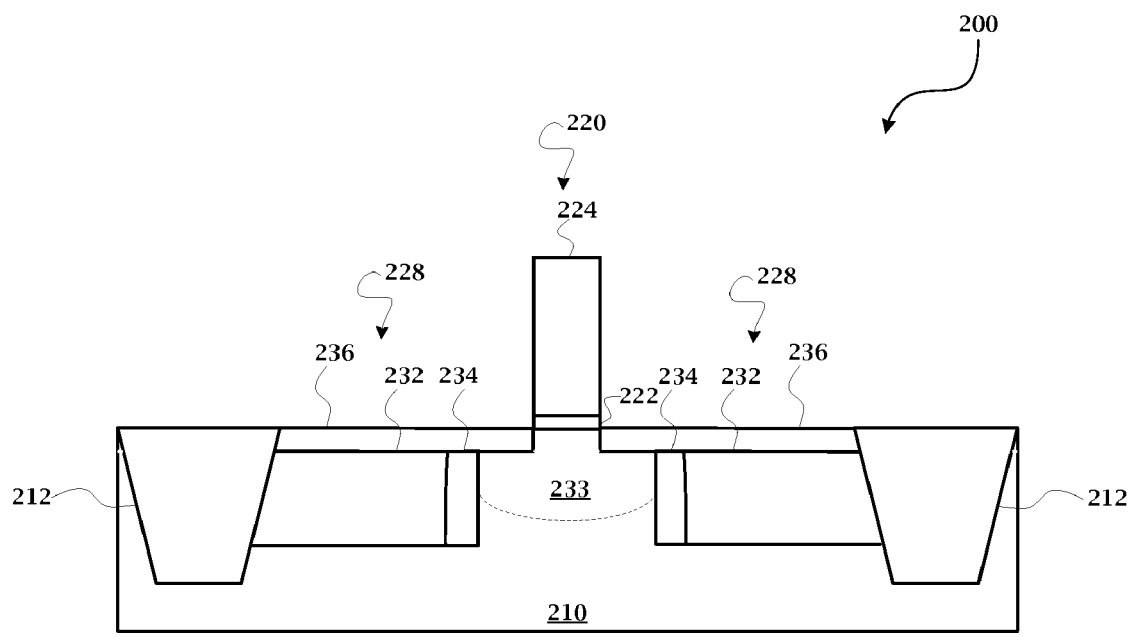
Figure 2G:
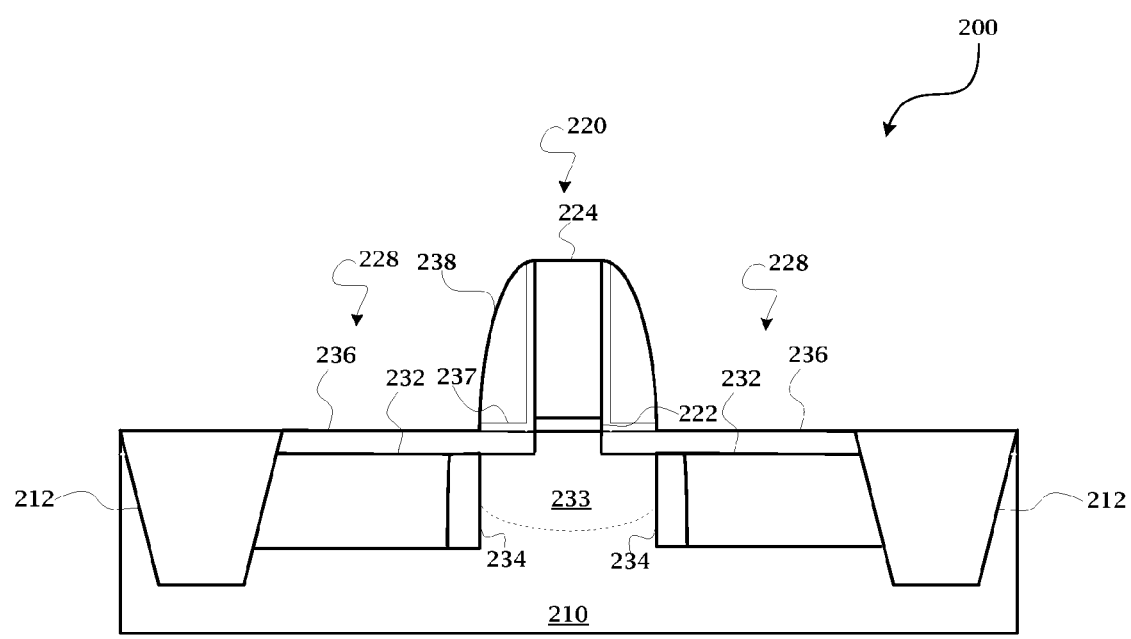
Figure 3A:
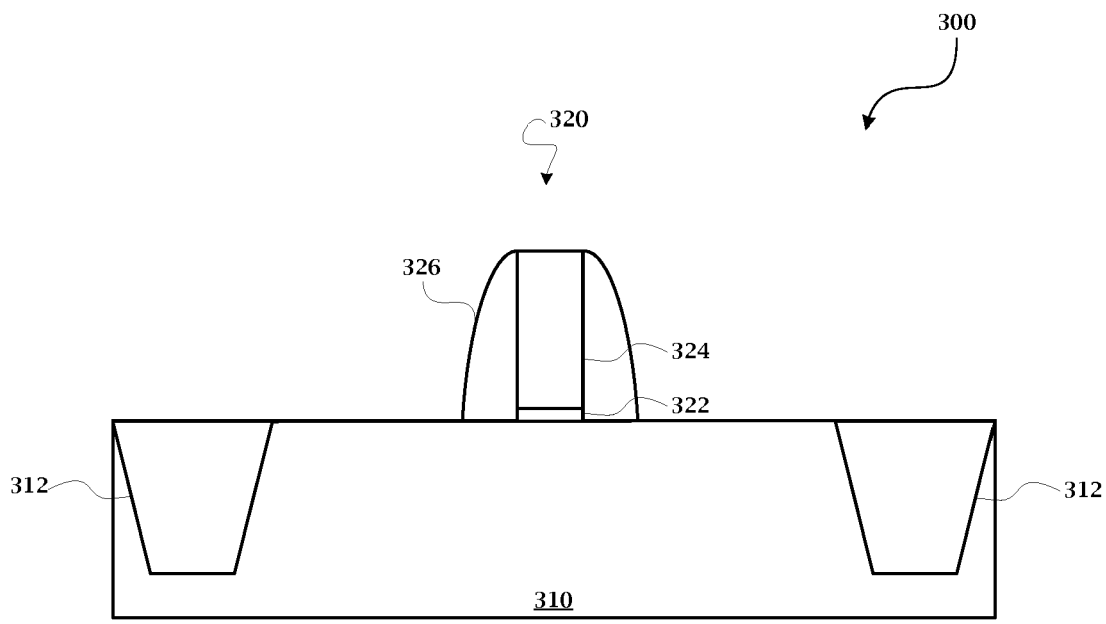
FIGS. 3A-3G are various cross-sectional views of embodiments of a semiconductor device during various fabrication stages according to the method of FIG. 1.
Figure 3B:
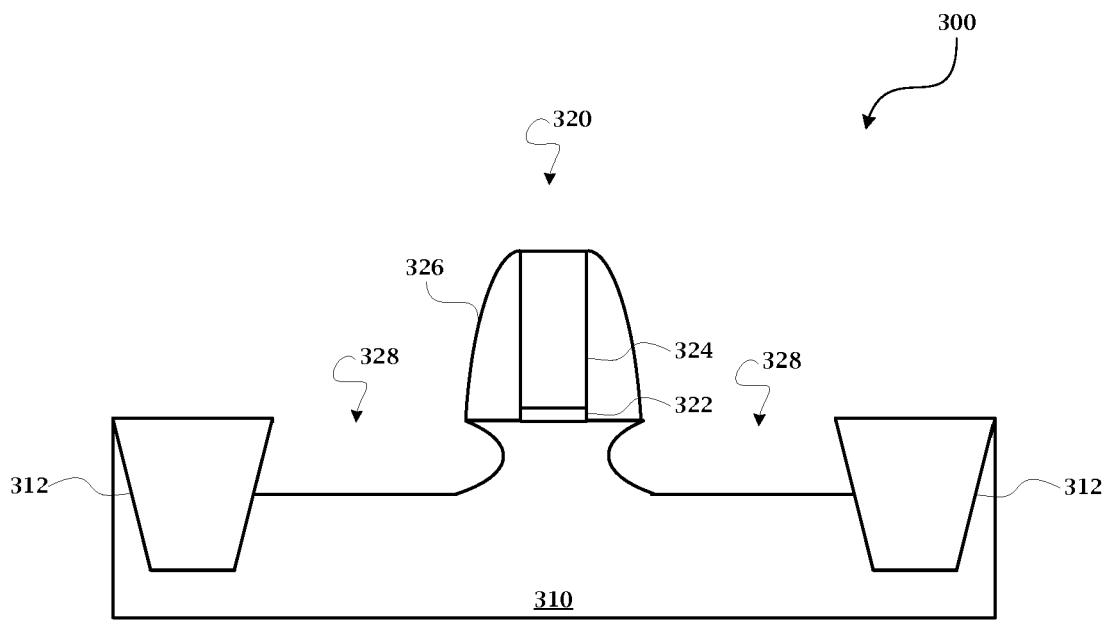
Figure 3C:
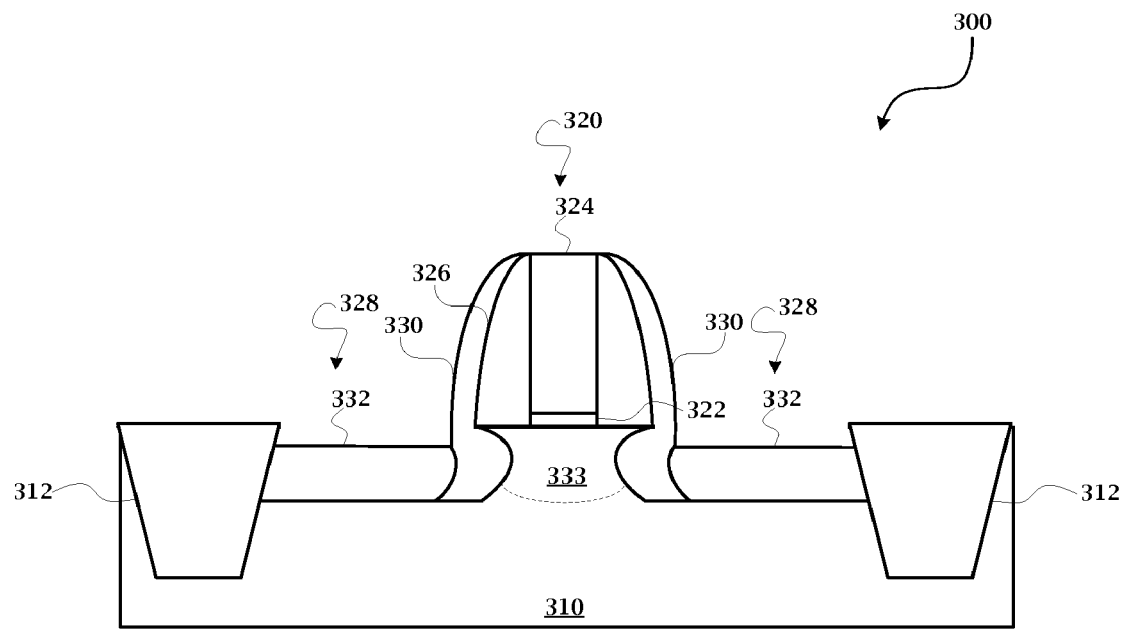
Figure 3D:
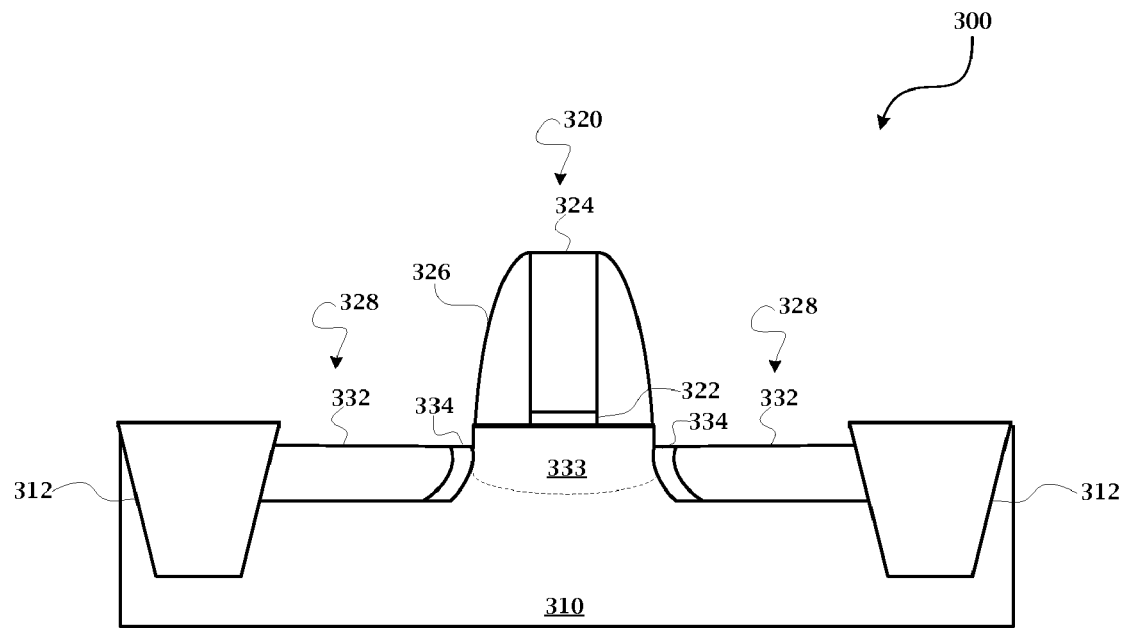
Figure 3E:
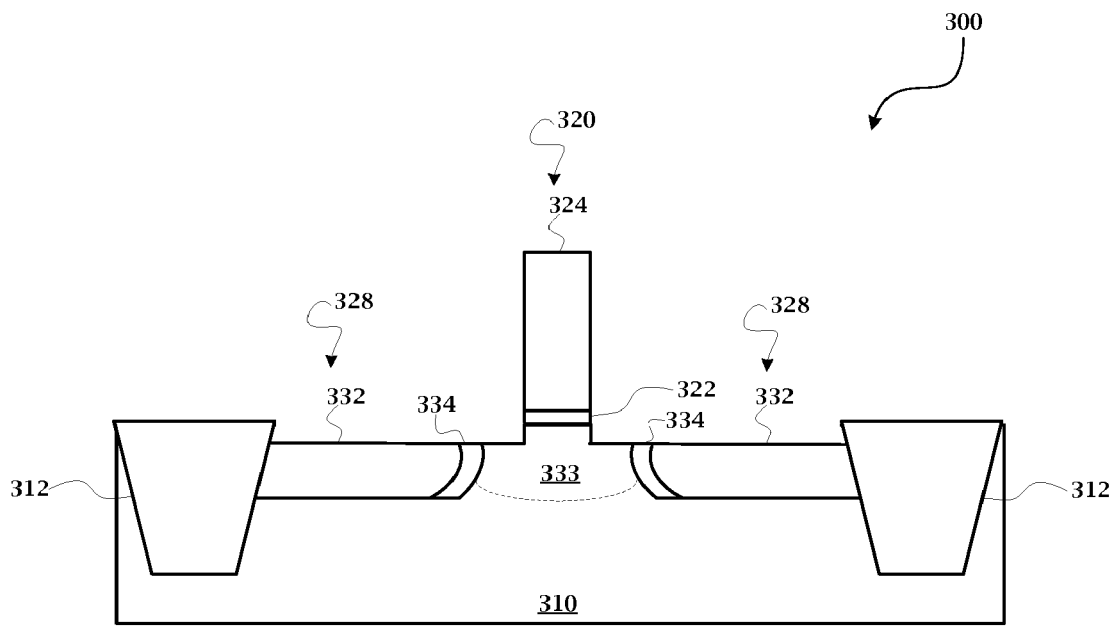
Figure 3F:
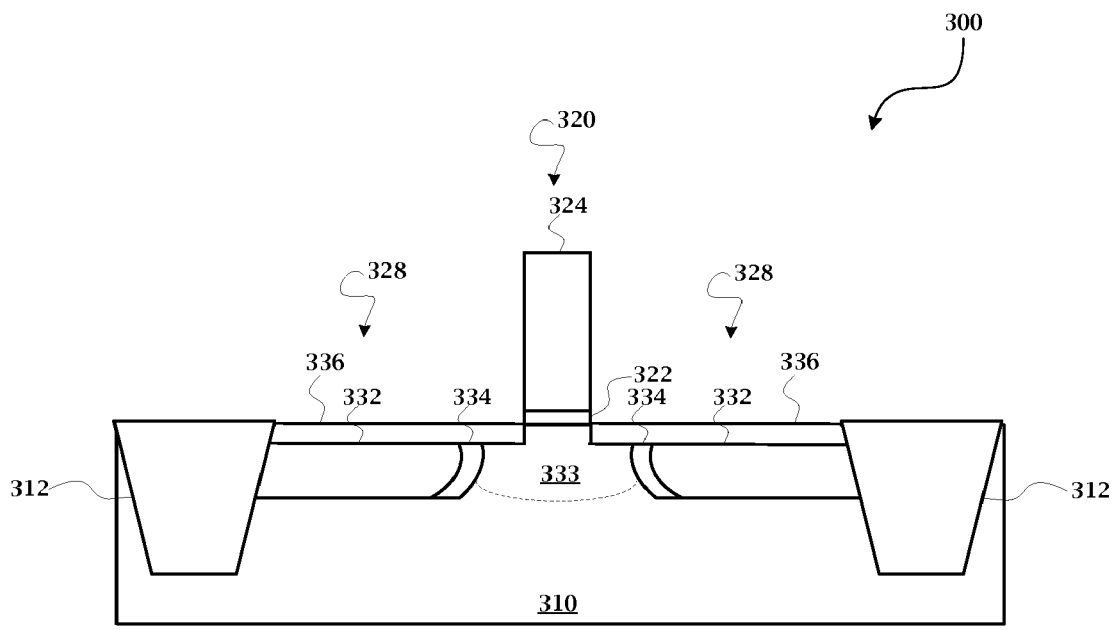
Figure 3G:
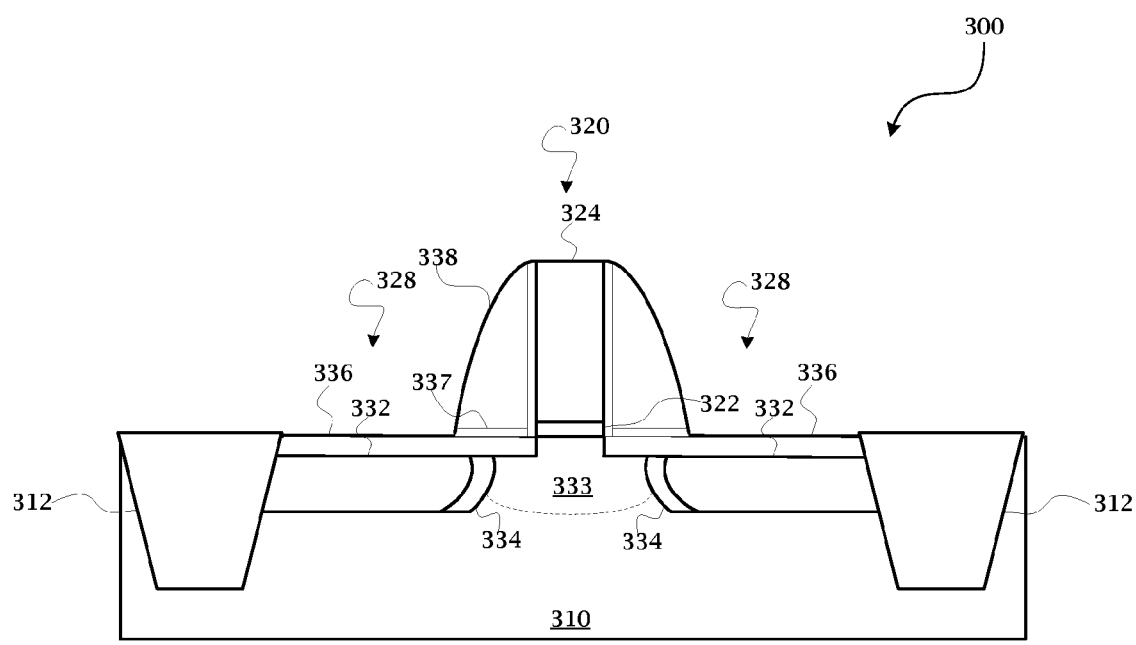
Figure 4:
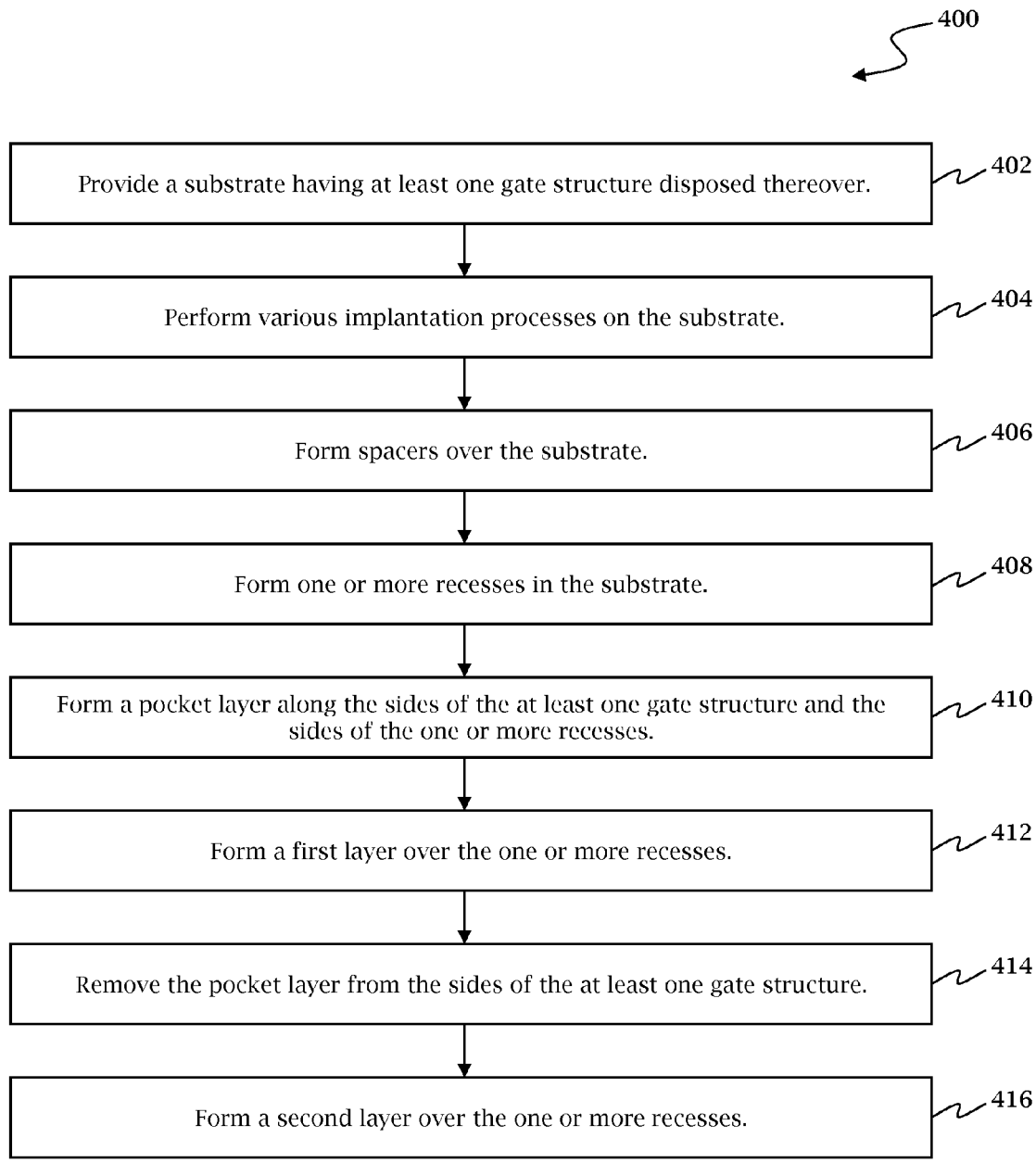
FIG. 4 is a flow chart of a method for fabricating a semiconductor device according to aspects of the present embodiments.

With reference to FIGS. 1 through 6G, methods 100, 400 and semiconductor devices 200, 300, 500, 600 are collectively described below. FIG. 1 is a flow chart of one embodiment of the method 100 for making the semiconductor devices 200, 300. FIGS. 2A-2G, 3A-3G are various cross-sectional views of the semiconductor devices 200, 300 according to one embodiment, in portion or entirety, during various fabrication stages of the method 100. FIG. 4 is a flow chart of one embodiment of the method 400 for making the semiconductor devices 500, 600. FIGS. 5A-5G, 6A-6G are various cross-sectional views of the semiconductor devices 500, 600 according to one embodiment, in portion or entirety, during various fabrication stages of the method 400. It is understood that additional steps can be provided before, during, and after the methods 100, 400, and some of the steps described below can be replaced or eliminated, for additional embodiments of the method. It is further understood that additional features can be added in the semiconductor devices 200, 300, 500, 600, and some of the features described below can be replaced or eliminated, for additional embodiments of the semiconductor devices 200, 300, 500, 600. The present embodiments of methods 100, 400 and semiconductor devices 200, 300, 500, 600 provides a semiconductor device with improved device performance.

The semiconductor devices 200, 300, 500, 600 may be fabricated in a gate first process, gate last process, or hybrid process including a gate first process and a gate last process. In the gate first process, a metal gate structure may be formed first and may be followed by a CMOS process flow to fabricate the final device. In the gate last process, a dummy poly gate structure may be formed first and may be followed by a normal CMOS process flow until deposition of an interlayer dielectric (ILD), and then the dummy poly gate structure may be removed and replaced with a metal gate structure. In the hybrid gate process, a metal gate structure of one type of device may be formed first and a metal gate structure of another type of device may be formed last.

Referring to FIGS. 1 and 2A, the method 100 begins at step 102 wherein a substrate 210 including one or more isolation regions 212 and at least one gate structure 220 is provided. In the present embodiment, the substrate 210 is a semiconductor substrate comprising silicon. The substrate 210 may comprise an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In one embodiment, the alloy semiconductor substrate may have a gradient SiGe feature in which the Si and Ge composition change from one ratio at one location to another location of the gradient SiGe feature. In another embodiment, the alloy SiGe is formed over a silicon substrate. In another embodiment, a SiGe substrate is strained. Furthermore, the substrate may be a semiconductor on insulator, such as a silicon on insulator (SOI), or a thin film transistor (TFT). In some examples, the substrate may include a doped epi layer or a buried layer. In other examples, the compound semiconductor substrate may have a multilayer structure, or the silicon substrate may include a multilayer compound semiconductor structure. In some examples, the substrate may comprise a non-semiconductor material, such as glass.

The semiconductor device 200 includes at least one isolation region 212 formed on the semiconductor substrate 210. The isolation region 212 may utilize isolation technology, such as local oxidation of silicon (LOCOS) or shallow trench isolation (STI), to define and electrically isolate various regions of the substrate 210, such as active and passive regions. In the present embodiment, the isolation region 212 includes a STI. The isolation region 212, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material, such as silicon oxide, silicon nitride, silicon oxynitride, fluoride-doped silicate glass (FSG), a low-K dielectric material, other suitable materials, and/or combinations thereof. In some embodiments, the filled trench may have a multi-layer structure such as a thermal oxide liner layer filled with silicon nitride or silicon oxide. In another example, the STI may be created using a processing sequence as follows: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

The at least one gate structure 220 is disposed over the semiconductor substrate 210. It is understood that a plurality of gate structures 220 may be formed. The gate structure 220 may be formed by any suitable process. For example, the gate structure 220 may be formed by conventional deposition, photolithography patterning, and etching processes, and/or combinations thereof. The deposition processes may include chemical vapor deposition (CVD), physical vapor deposition (PVD), atomic layer deposition (ALD), high density CVD (HPCVD), metal organic CVD (MOCVD), plasma enhanced CVD (PECVD), sputtering, plating, spin-on coating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the gate structure 220 may be formed by any combination of the processes described herein.

In the present embodiment, the gate structure 220 includes a gate dielectric layer 222, a gate layer 224, and dummy gate spacers 226. It is understood that the gate structure 220 may comprise additional layers above and/or below gate dielectric layer 222 and/or gate layer 224. For example, the gate structure 220 may comprise interfacial layers, capping layers, diffusion/barrier layers, dielectric layers, conductive layers, other suitable layers, and/or combinations thereof. Also, the semiconductor device 200 may comprise interfacial layers, capping layers, diffusion/barrier layers, dielectric layers, conductive layers, other suitable layers, and/or combinations thereof. In some embodiments, the semiconductor device 200 may include one or more antireflective coating layers, such as a top antireflective coating layer and/or a bottom antireflective coating layer.

The gate dielectric layer 222 is disposed over the semiconductor substrate 210. The gate dielectric layer 222 may comprise any suitable thickness and any suitable material, such as silicon oxide, silicon nitride, silicon oxynitride, hafnium oxide, zirconium oxide, titanium oxide, aluminum oxide, hafnium dioxide-alumina ($HfO_2$—$Al_2O_3$) alloy, metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, other suitable dielectric materials, and/or combinations thereof. The gate dielectric layer 222 may further include a multilayer structure comprising multiple dielectric materials. In some embodiments, the gate dielectric layer 222 may comprise a layer of silicon dioxide and a layer of high-k dielectric material. The gate dielectric layer 222 may be formed by any suitable process including the processes described herein.

The gate layer 224 is disposed over the gate dielectric layer 222. The gate layer 224 comprises any suitable thickness and any suitable material. For example, the gate layer 224 may comprise polycrystalline silicon; silicon-containing materials; germanium-containing materials; metal, such as aluminum, copper, tungsten, titanium, tantalum, titanium nitride, tantalum nitride, nickel silicide, cobalt silicide; other proper conductive materials; other suitable materials; and/or combinations thereof. In some embodiments, the gate layer 224 may comprise a multilayer structure. The gate layer 224 may be formed by any suitable process including the processes described herein.

The gate structure 220 further includes the dummy gate spacers 226. The dummy gate spacers 226 may comprise any suitable thickness. In the present embodiment, the dummy gate spacers 226 comprise a thickness between about 100 Å and about 300 Å. The dummy gate spacers 226, which are positioned on each side of the gate structure 220, may comprise a dielectric material such as silicon nitride, silicon oxide, silicon carbide, silicon oxynitride, other suitable materials, and/or combinations thereof. In the present embodiment, the dummy gate spacers 226 comprise a nitride material (e.g., silicon nitride). In some embodiments, the dummy gate spacers 226 may comprise a multilayer structure. The dummy gate spacers 226 may be formed by any suitable process including the processes described herein. In some embodiments, the gate structure 220 further includes dummy spacer liner.

Referring to FIG. 1 and FIGS. 2B-2G, one or more source/drain regions are formed, wherein the source/drain regions comprise a pocket. At step 104, one or more trenches (or recesses) are formed in the substrate. The one or more recesses define a source region and a drain region (collectively referred to as source/drain region) for the semiconductor device 200. In the present embodiment, as illustrated in FIG. 2B, one or more recesses 228 are formed on each side of the at least one gate structure 220. The recesses 228 may be formed by any suitable process. For example, recesses 228 may be formed by a selective etching process. The selective etching process may employ a wet etching process, a dry etching process, or a combination thereof. For example, a wet etching process may include exposure to a hydroxide containing solution (e.g., ammonium hydroxide), de-ionized water, and/or other suitable etchant solutions. In another example, forming the recess 214 may include patterning the semiconductor device 200 by a conventional process, such as forming a photoresist layer over the semiconductor device 200; patterning the photoresist layer by a conventional photolithography process; and etching recesses 228 in the substrate 210. The etching process may use one or more etching steps, and may be dry etching, wet etching, and/or other etching methods (e.g., reactive ion etching). The etching process may be either purely chemical (plasma etching), purely physical (ion milling), and/or combinations thereof. It is understood that the etching process may be tuned to result in varying profiles.

At step 106, a pocket layer is formed along the sides of the at least one gate structure and the sides of the one or more recesses. Referring to FIG. 2C, a pocket layer 230 is formed adjacent the dummy gate spacers 226 and vertical sidewalls of the recesses 228. The pocket layer 230 essentially extends from a top surface of the at least one gate structure 220 to a bottom surface of the recesses 228. The pocket layer 230 may be formed by any suitable process including the processes described herein. The pocket layer 230 comprises any suitable material. In the present embodiment, the pocket layer 230 comprises a dielectric material, particularly silicon oxide, silicon nitride, and/or silicon oxynitride. The dielectric material may comprise hafnium oxide, zirconium oxide, titanium oxide, aluminum oxide, hafnium dioxide-alumina ($HfO_2$—$Al_2O_3$) alloy, metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, other suitable dielectric materials, and/or combinations thereof. It is understood that the pocket layer 230 may comprise a multilayer structure. The pocket layer 230 further comprises any suitable thickness. In one example, the pocket layer 230 comprises a thickness between about 50 Å and about 200 Å.

Then, at step 108, a first layer is formed over the one or more recesses, wherein the first layer at least partially fills the one or more recesses. Referring again to FIG. 2C, a first layer 232 is formed to partially fill the recesses 228. The first layer 232 is formed by any suitable process. In the present embodiment, first layer 232 is formed by one or more epitaxial growth processes. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 210 (e.g., silicon). The first layer 232 comprises any suitable material, such as epitaxially grown silicon, SiGe, SiC, and/or combinations thereof. In the present embodiment, the first layer 232 comprises epitaxially grown SiGe. The recesses 228 (that define the source/drain regions) comprising the first layer 232 (i.e., epitaxially grown SiGe) achieves a strained channel 233 in the substrate 210. The strained channel can increase carrier mobility and enhance the performance of the semiconductor device 200. It is understood that, in some embodiments, the first layer 232 may be formed to entirely fill the recesses 228. In some embodiments, the first layer 232 may be formed to extend above a top surface of the recesses 228, forming a raised source/drain structure.

Referring to FIGS. 1 and 2D, at step 110, the pocket layer is removed from the sides of the at least one gate structure. More particularly, the pocket layer 230 is removed from each side of the gate structure 220. The pocket layer 230 may be removed by any suitable process, including the processes described herein. For example, the pocket layer 230 may be removed by a selective etching process. The selective etching process may employ one or more wet etching processes, dry etching processes, or combinations thereof. In the present embodiment, the pocket layer 230 is removed by a wet etching process. The wet etching process may include exposure to a hydroxide containing solution (e.g., ammonium hydroxide), de-ionized water, and/or other suitable etchant solutions. In the present embodiment, the pocket layer 230 is also partially removed within the recess 228. The pocket layer 230 is removed within recess 228 wherein a top surface of the pocket layer 230 is substantially coplanar with a top surface of the first layer 232. It is understood that the portions of the pocket layer 230 removed is not limited by the present embodiment.

Semiconductor devices having strained channels often comprise a silicon substrate and a source/drain region comprising epitaxially grown SiGe and/or SiC. The SiGe source/drain regions can increase electron hole mobility enhancement. However, during manufacturing, these devices are often exposed to one or more implantation processes (e.g., ion implantation processes to form various regions including lightly doped drain (LDD) regions and/or pocket regions). It has been observed that the one or more implantation processes degrade the stress introduced by the SiGe source/drain regions. Essentially, the implantation processes may induce relaxation in the SiGe source/drain regions, which causes a reduction in the strain effect. Further, defects at the interface of the SiGe source/drain regions and the substrate increase short channel effects (SCEs) by enhancing diffusion. These SCEs are difficult to control because such diffusion may be thermally induced.

Accordingly, in the present embodiment, the remaining pocket layer 230 forms pockets 234 within the recesses 228 (that define the source/drain region). The pockets 234 are disposed between the interface of the first layer 232 (i.e., epitaxially grown SiGe portions of the source/drain regions) and the substrate 210 (i.e., silicon substrate). Thus, the source/drain regions comprise the pockets 234 (in the present embodiment, a dielectric pocket). As noted above, the top surface of the first layer 232 is substantially coplanar with a top surface of the pockets 234. It should also be noted that the distance between the top surface of the pockets 234 and a bottom surface of the gate structure 220, for example, a gate stack of the gate structure, is controlled (or maintained) within a target range. The target range provides a range of distances between the top surface of the pockets 234 and a bottom surface of the gate structure 220 that will prevent current leakage and enhance the function of the stressed region. In the present embodiment, the distance between the top surface of the pockets 234 and a bottom surface of the gate dielectric layer 222 (i.e., a layer of the gate stack of gate structure 220) is controlled to prevent current leakage and enhance the stressed region functionality.

The pockets 234, essentially providing an abrupt junction between the source/drain region and substrate interface, may lead to significant improvement in SCEs and/or reduce current leakage. The increased control over the SCEs can allow continual semiconductor device scaling down. Further, in the present embodiment, the method 100 may reduce strain relaxation within the SiGe portions of the source/drain regions, which can improve the performance of semiconductor device 200. The present embodiment may further reduce channel doping levels. It is understood that the present embodiment may provide some, all, or none of the advantages described herein. It is further understood that different embodiments may have different advantages, and that no particular advantage is necessarily required of all embodiments.

At step 112, the one or more recesses are extended. The recesses 228 are extended by removing the dummy gate spacers 226, including a portion of the substrate 210 underneath the dummy gate spacers 226. The dummy gate spacers 226 may be removed by any suitable process, including the processes described herein. For example, the dummy gate spacers 226 may be removed by a selective etching process. The selective etching process may employ one or more wet etching processes, dry etching processes, or combinations thereof. In the present embodiment, the dummy gate spacers 226 are removed by a wet etching process. The wet etching process may include exposure to a hydroxide containing solution (e.g., ammonium hydroxide), de-ionized water, and/or other suitable etchant solutions. Portions of the substrate 210, which underlie the dummy gate spacers 226, are also removed to extend the recesses 228 as illustrated in FIG. 2E. The portions of the substrate 210 may be removed by the process utilized to remove the dummy gate spacers 226. It is understood that the pocket layer 230, dummy gate spacers 226, and/or portions of the substrate 210 underlying the dummy gate spacers 226 may be removed utilizing simultaneous or independent processes.

A second layer is then formed over the one or more recesses at step 114. Referring to FIG. 2F, a second layer 236 is formed to partially fill the recesses 228, wherein the second layer 236 fills the recess extension. In some embodiments, the second layer 236 may be formed to entirely fill the recesses 228. In some embodiments, the second layer 236 may be formed to extend above a top surface of the recesses 228, forming a raised source/drain structure. The second layer 236 is formed by any suitable process. In the present embodiment, second layer 236 is formed by epitaxial growth. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 210 (e.g., silicon). The second layer 236 comprises any suitable material, such as epitaxially grown silicon, SiGe, SiC, and/or combinations thereof. In the present embodiment, the second layer 236 comprises epitaxial grown SiGe. The second layer 236 comprises any suitable thickness. For example, the second layer 236 may comprise a thickness between about 50 Å and about 200 Å.

In the present embodiment, the epitaxial grown first layer 232 and second layer 236 may be in-situ doped or undoped during the epitaxial growth. For example, in the present embodiment, the first layer 232 comprises undoped epitaxial grown SiGe, and the second layer 236 comprises in-situ doped epitaxial grown SiGe. When the first and/or second layers 232, 236 are undoped, it is understood that the undoped layers may be doped in subsequent processing. The undoped layers may be doped by one or more various implantation processes. The various implantation processes may comprise conventional ion implantation process, plasma immersion ion implantation (PIII) processes, gas and/or solid source diffusion processes, other suitable processes, and/or combinations thereof. The first and/or second layers 232, 236 may further be exposed to annealing processes, such as a rapid thermal annealing process. The various implantation and/or annealing processes may be performed at any suitable time during the fabrication of semiconductor device 200.

Referring to FIGS. 1 and 2G, at step 116, one or more gate spacers are formed over the substrate 210. One or more gate spacer liners may also be formed. In the present embodiment, gate spacer liner 237 and gate spacers 238 are positioned on each side of the gate dielectric layer 222/gate layer 224 of the gate structure 220 (e.g., along the sidewalls of the gate dielectric layer 222 and gate layer 224 of the gate structure 220). The gate spacer liner 237 may comprise any suitable material and be formed by any suitable process. For example, the gate spacer liner 237 may comprise a spacer oxide. The gate spacers 238 may comprise a dielectric material, such as silicon nitride, silicon oxide, silicon carbide, silicon oxynitride, other suitable materials, and/or combinations thereof. In the present embodiment, the gate spacers 238 comprise silicon nitride. The gate spacers 238 may be formed by any suitable process. In one example, the gate spacers 238 are formed by blanket depositing a dielectric layer over the semiconductor device 200, and then, anisotropically etching to remove the dielectric layer to form gate spacers 238 as illustrated in FIG. 2G. In some embodiments, the gate spacer liner 237 and/or gate spacers 238 may comprise a multilayer structure. In some embodiments, the gate spacer liner 237 and/or gate spacers 238 may be omitted partially or entirely.

FIGS. 3A-3G provide various cross-sectional views of another embodiment of a semiconductor device 300 during various fabrication stages according to the method of FIG. 1. The semiconductor device 300 is similar to the semiconductor device 200. Referring to FIG. 3A, at step 102, a substrate 310 including one or more isolation regions 312 and at least one gate structure 320 is provided. The at least one gate structure 320 includes a gate stack (i.e., a gate dielectric layer 322 and gate layer 324) and dummy gate spacers 326. The substrate 310, isolation regions 312, gate structure 320 including gate dielectric layer 322, gate layer 324, and dummy gate spacers 326 may be similar to the substrate 210, isolation regions 212, and gate structure 220 including gate dielectric layer 222, gate layer 224, and dummy gate spacers 226 described in FIG. 2A.

Referring to FIG. 1 and FIGS. 3B-3G, one or more source/drain regions are formed, wherein the source/drain regions comprise a pocket. At step 104, one or more trenches (or recesses) are formed in the substrate. The one or more recesses define a source region and a drain region (collectively referred to as source/drain region) for the semiconductor device 300. In the present embodiment, as illustrated in FIG. 3B, one or more recesses 328 are formed on each side of the at least one gate structure 320. The recesses 328 may be formed by any suitable process and may be similar to the recesses 228 illustrated in FIG. 2B. In the present embodiment, the recesses 328 are isotropic recesses, formed by one or more isotropic etching processes. The isotropic etching process forms recesses 328 that extend under the gate structure 320, and specifically, in the present embodiment, under dummy gate spacers 326. It is understood that the isotropic recesses 328 may extend any distance below the gate structure 320. Further, the recesses 328 comprise any suitable profile. As shown in FIG. 3B, at least one of the vertical sidewalls of the recesses 228 comprises a curved profile.

At step 106, a pocket layer is formed along the sides of the at least one gate structure and the sides of the one or more recesses. Referring to FIG. 3C, a pocket layer 330 is formed adjacent the dummy gate spacers 326 and vertical, curved sidewalls of the recesses 328. Then, at step 108, a first layer is formed over the one or more recesses, wherein the first layer at least partially fills the one or more recesses. More particularly, a first layer 332 is formed to partially fill the recesses 328. The pocket layer 330 and first layer 332 is similar to pocket layer 230 and first layer 232 illustrated in FIG. 2C. In the present embodiment, the first layer 332 comprises epitaxially grown SiGe. The recesses 328 (that define the source/drain regions) comprising the first layer 332 (i.e., epitaxially grown SiGe) achieves a strained channel 333 in the substrate 310. The strained channel can increase carrier mobility and enhance the performance of the semiconductor device 300. It should be noted that, in the present embodiment, the isotropic recesses 328 increase the volume of the epitaxially grown SiGe within the recesses 328, particularly the volume of the first layer 332 within the recesses 328. The isotropic recesses 328 having the first layer 332 can result in an increased strained channel effect in the substrate 310, contributing to enhanced performance of the semiconductor device 300.

Referring to FIGS. 1 and 3D, at step 110, the pocket layer is removed from the sides of the at least one gate structure. More particularly, the pocket layer 330 is removed from each side of the gate structure 320. The pocket layer 330 may be removed by any suitable process, including the processes described herein. In the present embodiment, the pocket layer 330 is also partially removed within the recess 328. The pocket layer 330 is removed within recess 328 wherein a top surface of the pocket layer 330 is substantially coplanar with a top surface of the first layer 332. The remaining pocket layer 330 forms pockets 334 within the recesses 328 (that define the source/drain region). The pockets 234 are disposed between the interface of the first layer 332 (i.e., epitaxially grown SiGe portions of the source/drain regions) and the substrate 310 (i.e., silicon substrate). Thus, the source/drain regions comprise the pockets 334 (in the present embodiment, a dielectric pocket).

As noted above, the top surface of the first layer 332 is substantially coplanar with a top surface of the pockets 334. It should also be noted that the distance between the top surface of the pockets 334 and a bottom surface of the gate structure 320, for example, a gate stack of the gate structure, is controlled (or maintained) within a target range. The target range provides a range of distances between the top surface of the pockets 334 and a bottom surface of the gate structure 320 that will prevent current leakage and enhance the function of the stressed region. In the present embodiment, the distance between the top surface of the pockets 334 and a bottom surface of the gate dielectric layer 322 (i.e., a layer of the gate stack of gate structure 320) is controlled to prevent current leakage and enhance the stressed region functionality.

The pockets 334, essentially providing an abrupt junction between the source/drain region and substrate interface, may lead to significant improvement in SCEs and/or reduce current leakage. The increased control over the SCEs can allow continual semiconductor device scaling down. Further, in the present embodiment, the method 100 may reduce strain relaxation within the SiGe portions of the source/drain regions and/or reduce channel doping levels, which can improve performance of semiconductor device 300. It is understood that the present embodiment may provide some, all, or none of the advantages described herein. It is further understood that different embodiments may have different advantages, and that no particular advantage is necessarily required of all embodiments.

At step 112, the one or more recesses are extended. The recesses 328 are extended by removing the dummy gate spacers 326, including a portion of the substrate 310 underneath the dummy gate spacers 326. The dummy gate spacers 326 may be removed by any suitable process, including the processes described herein. Portions of the substrate 310, which underlie the dummy gate spacers 326, are also removed to extend the recesses 328 as illustrated in FIG. 3E. The portions of the substrate 310 may be removed by the process utilized to remove the dummy gate spacers 326. It is understood that the pocket layer 330, dummy gate spacers 326, and/or portions of the substrate 310 underlying the dummy gate spacers 326 may be removed utilizing simultaneous or independent processes.

A second layer is then formed over the one or more recesses at step 114. Referring to FIG. 3F, a second layer 336 is formed to partially fill the recesses 328, wherein the second layer 336 fills the recess extension. In some embodiments, the second layer 336 may be formed to entirely fill the recesses 328. In some embodiments, the second layer 336 may be formed to extend above a top surface of the recesses 328, forming a raised source/drain structure. The second layer 336 is similar to the second layer 236 described with reference to FIG. 2F, and in the present embodiment, the second layer 336 comprises epitaxial grown SiGe. Referring to FIGS. 1 and 3G, at step 116, one or more gate spacers are formed over the substrate 310. One or more gate spacer liners may also be formed. In the present embodiment, gate spacer liner 337 and gate spacers 338 are positioned on each side of the gate stack (i.e., gate dielectric layer 322 and gate layer 324) of the gate structure 320. The gate spacer liner 337 and gate spacers 338 are similar to the gate spacer liner 237 and gate spacers 238 illustrated in FIG. 2G.

The semiconductor devices 200, 300 comprise pockets 234, 334 that provide an abrupt junction between the source/drain region and substrate interface, which may allow better control of SCEs. Further, the method 100 may prevent semiconductor devices 200, 300 from being exposed to one or more ion implantation processes, such as LDD implantation and pocket implantation processes, which often cause source/drain region relaxation. It is understood that the semiconductor devices 200, 300 may undergo further CMOS or MOS technology processing to form various features known in the art. For example, in some embodiments, the source/drain regions may be exposed to an implantation process to form deep source/drain regions. In some embodiments, S/D regions comprising first layer 232, 332, pockets 234, 334, and second layer 236, 336, and/or gate structure 220, 320 may comprise silicide regions having any suitable composition. In still another example, various contacts/vias and multilayer interconnect features (e.g., metal layers and interlayer dielectrics) may be formed on the substrates 210, 310 and configured to connect the various features or structures of the semiconductor device 200, 300.

Figure 5A:
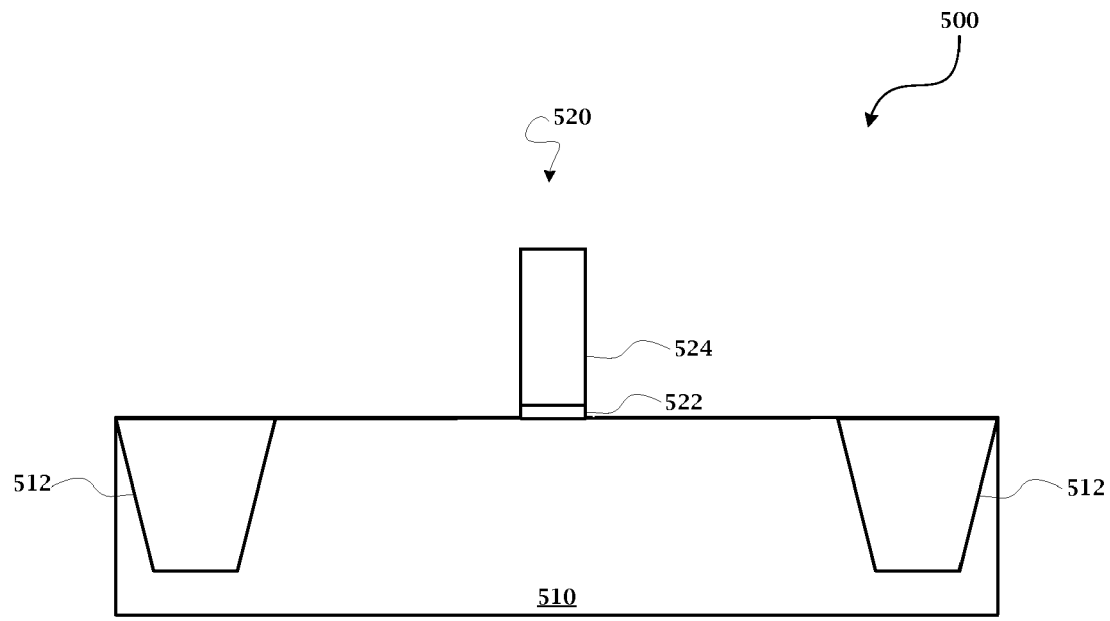
FIGS. 5A-5G are various cross-sectional views of embodiments of a semiconductor device during various fabrication stages according to the method of FIG. 4.
Figure 5B:
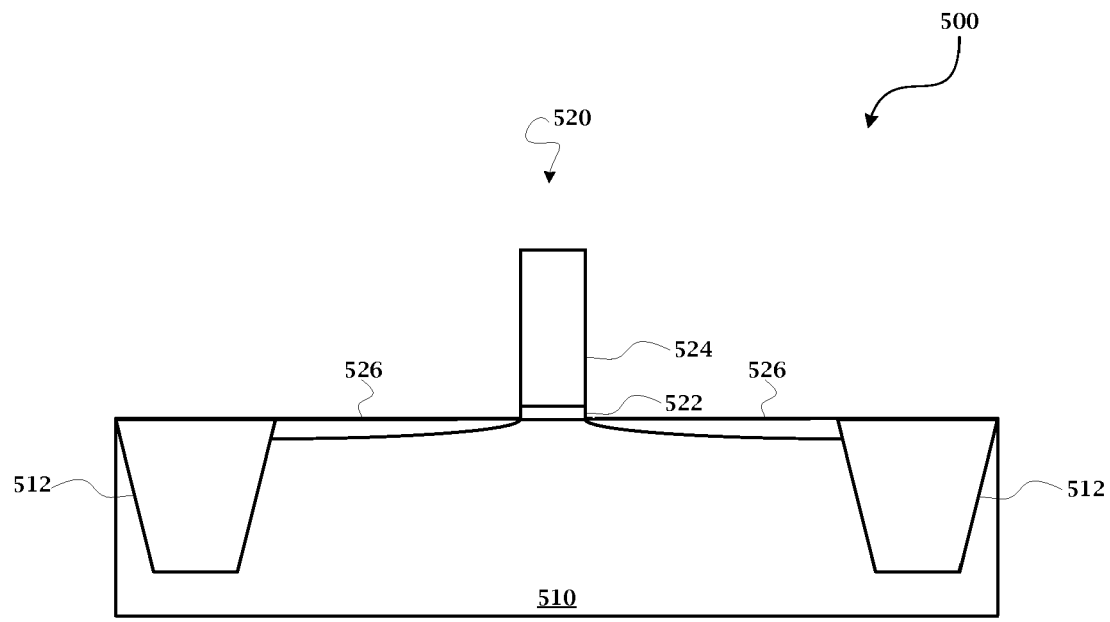

Referring to FIGS. 4 and 5A, the method 400 begins at step 402 wherein a substrate 510 including one or more isolation regions 512 and at least one gate structure 520 is provided. In the present embodiment, the substrate 510 is a semiconductor substrate comprising silicon. The substrate 510 may comprise an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the substrate may be a semiconductor on insulator, such as a silicon on insulator (SOI), or a thin film transistor (TFT). In some examples, the substrate may include a doped epi layer or a buried layer. In other examples, the compound semiconductor substrate may have a multilayer structure, or the silicon substrate may include a multilayer compound semiconductor structure. In some examples, the substrate may comprise non-semiconductor materials, such as a glass substrate.

The semiconductor device 500 includes at least one isolation region 512 formed on the semiconductor substrate 510. The isolation region 512 may utilize isolation technology, such as local oxidation of silicon (LOCOS) or shallow trench isolation (STI), to define and electrically isolate various regions of the substrate, such as active and passive regions. In the present embodiment, the isolation region 512 includes a STI. The isolation region 512, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material, such as silicon oxide, silicon nitride, silicon oxynitride, fluoride-doped silicate glass (FSG), a low-K dielectric material, other suitable materials, and/or combinations thereof. In some embodiments, the filled trench may have a multi-layer structure such as a thermal oxide liner layer filled with silicon nitride or silicon oxide. In another example, the STI may be created using a processing sequence as follows: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

The at least one gate structure 520 is disposed over the semiconductor substrate 510. It is understood that a plurality of gate structures 520 may be formed. The gate structure 520 may be formed by any suitable process. For example, the gate structure 520 may be formed by conventional deposition, photolithography patterning, and etching processes, and/or combinations thereof. The deposition processes may include CVD, PVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the gate structure 520 may be formed by any combination of the processes described above.

In the present embodiment, the gate structure 520 includes a gate stack comprising a gate dielectric layer 522 and a gate layer 524. It is understood that the gate stack may comprise additional layers above and/or below the gate dielectric layer 522 and/or the gate layer 524. For example, the gate stack may comprise interfacial layers, capping layers, diffusion/barrier layers, dielectric layers, conductive layers, other suitable layers, and/or combinations thereof. Also, the semiconductor device 500 may comprise interfacial layers, capping layers, diffusion/barrier layers, dielectric layers, conductive layers, other suitable layers, and/or combinations thereof. In some embodiments, the semiconductor device 500 may include one or more antireflective coating layers, such as a top antireflective coating layer and/or a bottom antireflective coating layer.

The gate dielectric layer 522 is disposed on the semiconductor substrate 510. The gate dielectric layer 522 may comprise any suitable thickness and any suitable material, such as silicon oxide, silicon nitride, silicon oxynitride, hafnium oxide, zirconium oxide, titanium oxide, aluminum oxide, hafnium dioxide-alumina ($HfO_2$—$Al_2O_3$) alloy, metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, other suitable dielectric materials, and/or combinations thereof. The gate dielectric layer 522 may further include a multilayer structure comprising multiple dielectric materials. In some embodiments, the gate dielectric layer 522 may comprise a layer of silicon dioxide and a layer of high-k dielectric material. The gate dielectric layer 522 may be formed by any suitable process including the processes described herein.

The gate layer 524 is disposed over the gate dielectric layer 522. The gate layer 522 comprises any suitable thickness and any suitable material. For example, the gate layer 524 may comprise polycrystalline silicon; silicon-containing materials; germanium-containing materials; metal, such as aluminum, copper, tungsten, titanium, tantulum, titanium nitride, tantalum nitride, nickel silicide, cobalt silicide; other proper conductive materials; other suitable materials; and/or combinations thereof. In some embodiments, the gate layer 524 may comprise a multilayer structure. The gate layer 524 may be formed by any suitable process including the processes described herein.

At step 404, various implantation processes are performed on the substrate 510. The various ion implantation process may form various doped regions. The doped regions may be doped n-type and/or p-type. The doped regions may comprise various doping profiles and may be formed by a plurality of ion implantation processes, such as lightly doped drain (LDD) implant processes and source/drain (S/D) implant processes. In the present embodiment, referring to FIG. 5B, lightly doped drain (LDD) regions 526 are formed by one or more ion implantation processes. The at least one gate structure 520 may be utilized as an implanting mask. The LDD regions 526 are substantially aligned with the edges of the gate stack. Additionally, the various implantation processes may comprise one or more halo/pocket implantation processes. Halo/pocket implantation processes may be implemented to eliminate short channel effects.

Figure 5C:
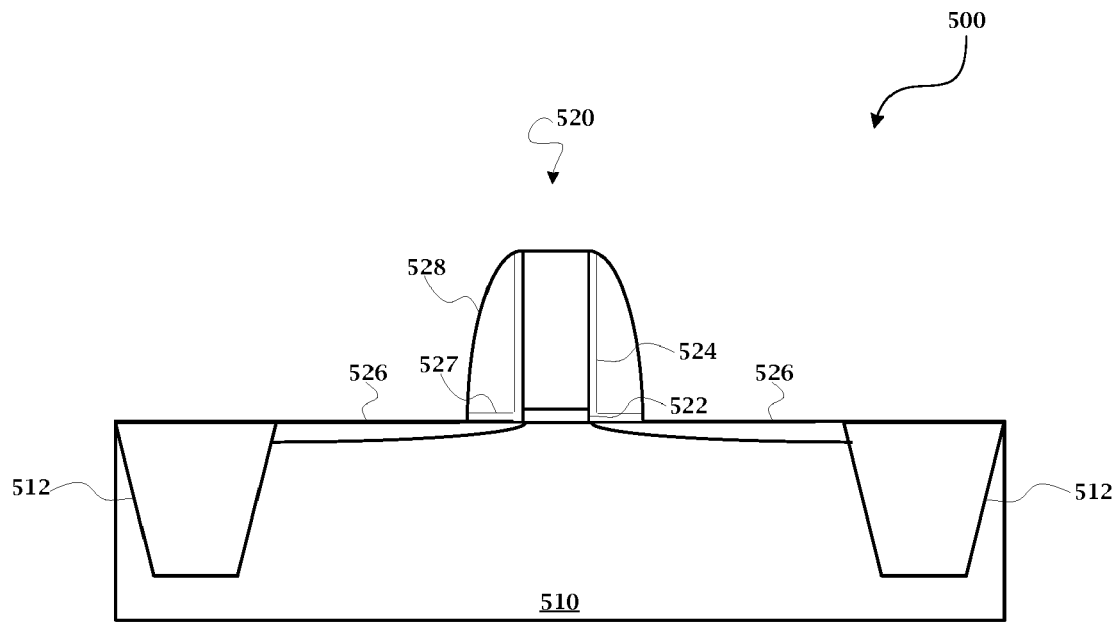

Referring to FIGS. 4 and 5C, at step 406, one or more gate spacers are formed over the substrate 510. In some embodiments, one or more gate spacer liners may also be formed over the substrate 510. In the present embodiment, gate spacer liners 427 and gate spacers 528 are positioned on each side of the gate stack (i.e., gate dielectric layer 522/gate layer 524) of the gate structure 520 (e.g., along the sidewalls of the gate dielectric layer 522 and gate layer 524 of the gate structure 520). The gate spacer liner 427 may comprise any suitable material and be formed by any suitable process. For example, the gate spacer liner 427 may comprise a spacer oxide. The gate spacers 528 may comprise a dielectric material, such as silicon nitride, silicon oxide, silicon carbide, silicon oxynitride, other suitable materials, and/or combinations thereof. The gate spacers 528 may be formed by any suitable process. In one example, the gate spacers 528 are formed by blanket depositing a dielectric layer over the semiconductor device 500, and then, anisotropically etching to remove the dielectric layer to form gate spacers 528 as illustrated in FIG. 5C. In some embodiments, the gate spacer liner 427 and/or gate spacers 528 may comprise a multilayer structure. In some embodiments, the gate spacer liner 427 and/or gate spacers 528 may be omitted partially or entirely.

Figure 5D:
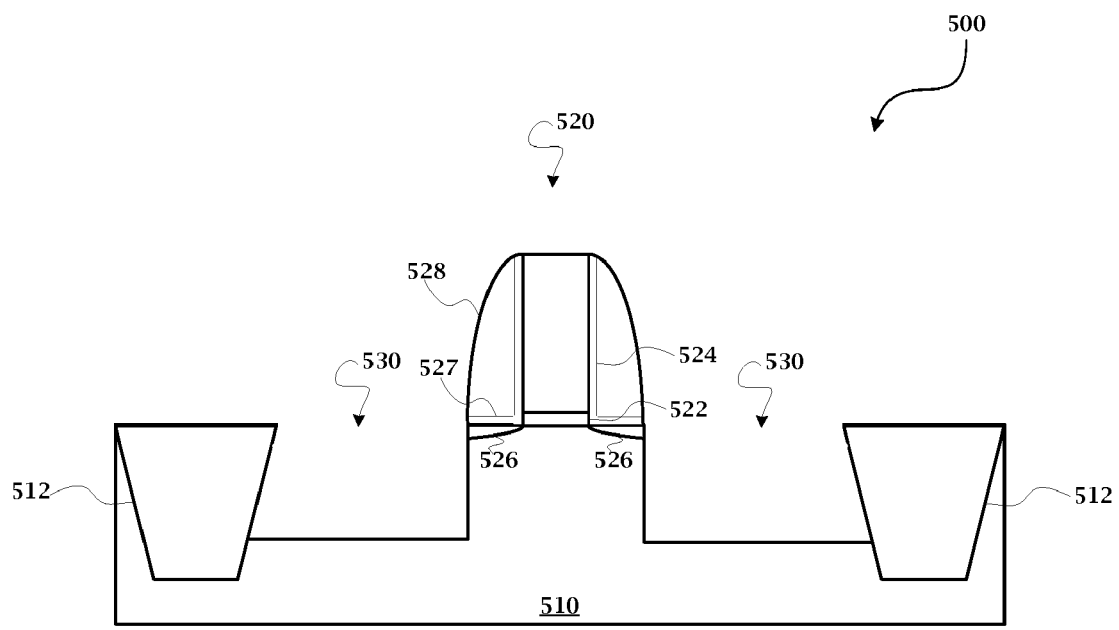

Referring to FIGS. 5D-5G, one or more source/drain regions are formed, wherein the source/drain regions comprise a pocket. At step 408, one or more trenches and/or recesses are formed in the substrate. In the present embodiment, as illustrated in FIG. 5D, one or more recesses 530 are formed on each side of the at least one gate structure 520. The recesses 530 are substantially aligned with the gate spacers 528 of the gate structure 520. The recesses 530 may be formed by any suitable process. For example, the recesses 530 may be removed by a selective etching process. The selective etching process may employ one or more wet etching processes, dry etching processes, and/or combinations thereof. A wet etching process may include exposure to a hydroxide containing solution (e.g., ammonium hydroxide), de-ionized water, and/or other suitable etchant solutions. In another example, forming recesses 530 may include patterning the semiconductor device 500 by a conventional process, such as forming a photoresist layer over the semiconductor device 500; patterning the photoresist layer by a conventional photolithography process; and etching recesses 500 in the substrate 510. The etching process may use one or more etching steps, and may include dry etching, wet etching, and/or other etching methods (e.g., reactive ion etching). The etching process may be either purely chemical (plasma etching), purely physical (ion milling), and/or combinations thereof. It is understood that the etching process may be tuned to result in varying profiles.

Figure 5E:
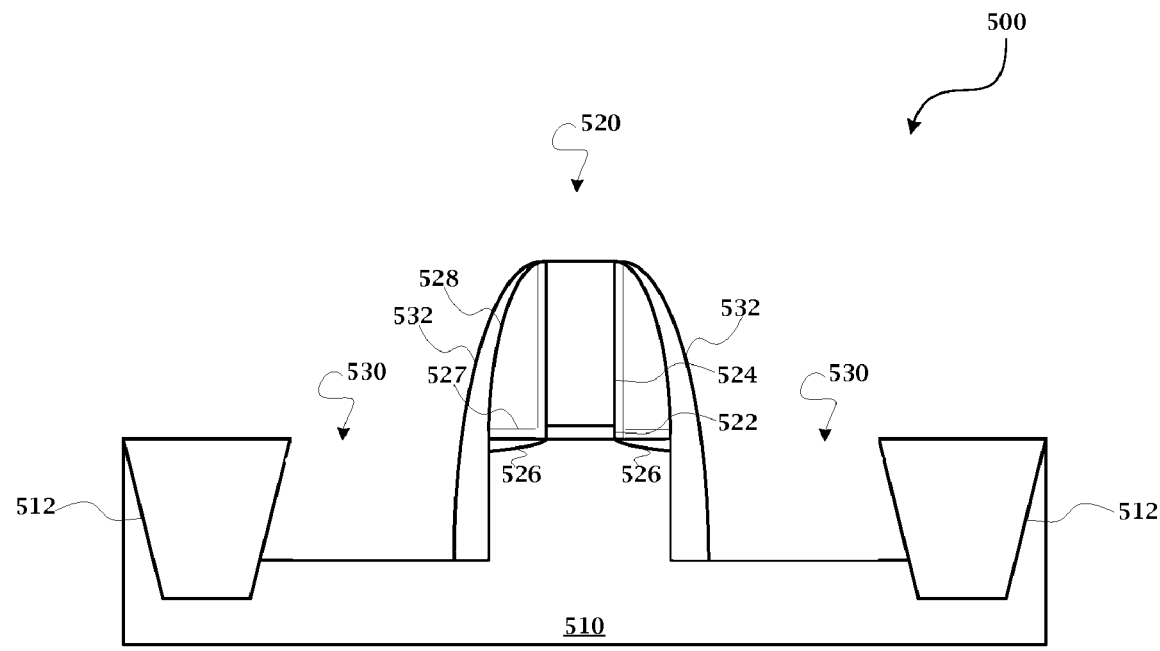

At step 410, a pocket layer is formed along the sides of the at least one gate structure and the sides of the one or more recesses. Referring to FIG. 5E, a pocket layer 532 is formed adjacent the gate spacers 528 and vertical sidewalls of the recesses 530. The pocket layer 532 essentially extends from a top surface of the at least one gate structure 520 to a bottom surface of the recesses 530. The pocket layer 532 may be formed by any suitable process including the processes described herein. The pocket layer 532 comprises any suitable material. In the present embodiment, the pocket layer 532 comprises a dielectric material, particularly silicon oxide, silicon nitride, and/or silicon oxynitride. The dielectric material may comprise hafnium oxide, zirconium oxide, titanium oxide, aluminum oxide, hafnium dioxide-alumina ($HfO_2$—$Al_2O_3$) alloy, metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, other suitable dielectric materials, and/or combinations thereof. It is understood that the pocket layer 532 may comprise a multilayer structure. The pocket layer 532 further comprises any suitable thickness. In one example, the pocket layer 532 comprises a thickness between about 50 Å and about 200 Å.

Figure 5F:
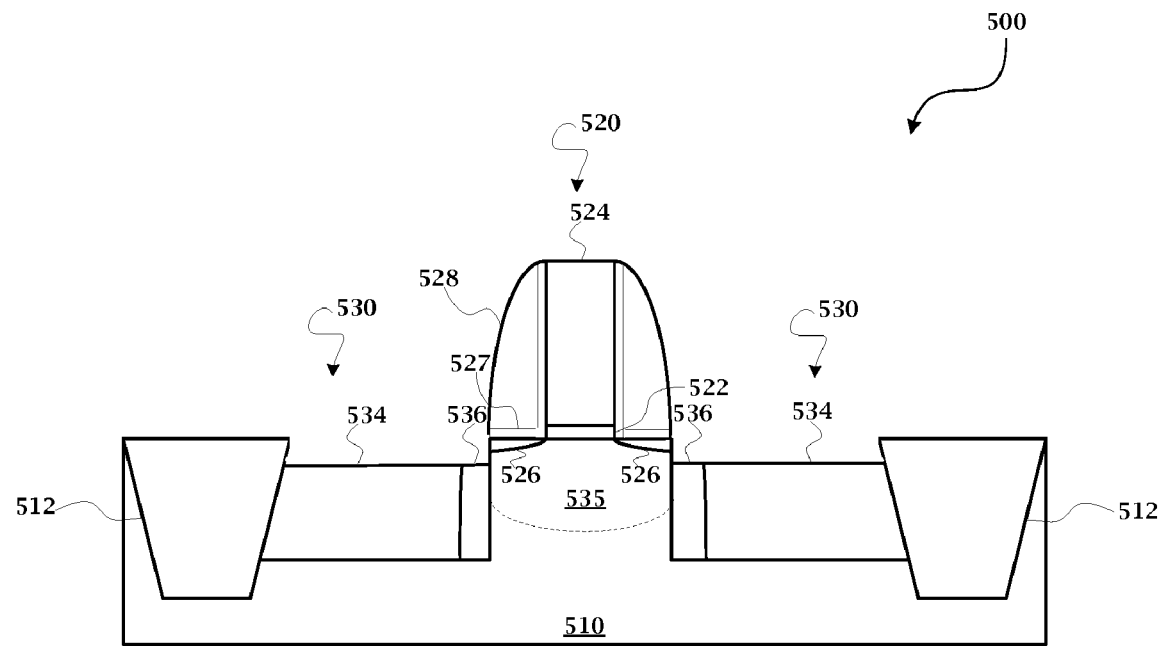

Then, at step 412, a first layer is formed over the one or more recesses, wherein the first layer at least partially fills the one or more recesses. Referring to FIG. 5F, a first layer 534 is formed to partially fill the recesses 530. The first layer 534 is formed by any suitable process. In the present embodiment, first layer 534 is formed by one or more epitaxial growth processes. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 510 (e.g., silicon). The first layer 534 comprises any suitable material, such as epitaxially grown silicon, SiGe, SiC, and/or combinations thereof. In the present embodiment, the first layer 534 comprises epitaxially grown SiGe. The recesses 530 (that define the source/drain regions) comprising the first layer 534 (i.e., epitaxially grown SiGe) achieves a strained channel 435 in the substrate 510. The strained channel can increase carrier mobility and enhance the performance of the semiconductor device 500. It is understood that, in some embodiments, the first layer 534 may be formed to entirely fill the recesses 530. In some embodiments, the first layer 534 may be formed to extend above a top surface of the recesses 530, forming a raised source/drain structure.

Referring again to FIG. 5F, at step 414, the pocket layer is removed from the sides of the at least one gate structure. More particularly, the pocket layer 532 is removed from each side of the gate structure 520. The pocket layer 532 may be removed by any suitable process, including the processes described herein. For example, the pocket layer 532 may be removed by a selective etching process. The selective etching process may employ one or more wet etching processes, dry etching processes, or combinations thereof. In the present embodiment, the pocket layer 532 is removed by a wet etching process. The wet etching process may include exposure to a hydroxide containing solution (e.g., ammonium hydroxide), de-ionized water, and/or other suitable etchant solutions. In the present embodiment, the pocket layer 532 is also partially removed within the recess 530. The pocket layer 532 is removed within the recesses 530 wherein a top surface of the pocket layer 532 is substantially coplanar with a top surface of the first layer 534. It is understood that the portions of the pocket layer 230 removed is not limited by the present embodiment.

As discussed above, semiconductor devices having strained channels often comprise a silicon substrate and a source/drain region comprising epitaxially grown SiGe and/or SiC. These conventional devices often exhibit degraded device performance resulting from one or more implantation processes that degrade the stress introduced by the SiGe source/drain regions and/or increasing short channel effects. Accordingly, in the present embodiment, the remaining pocket layer 532 forms pockets 536 within the recesses 530 (that define the source/drain region). The pockets 536 are disposed between the interface of the first layer 534 (i.e., epitaxially grown SiGe portions of the source/drain regions) and the substrate 510 (i.e., silicon substrate). Thus, the source/drain regions comprise pockets 536 (in the present embodiment, a dielectric pocket). As noted above, the top surface of the first layer 534 is substantially coplanar with a top surface of the pockets 536. It should also be noted that the distance between the top surface of the pockets 536 and a bottom surface of the gate structure 520, for example, a gate stack of the gate structure, is controlled (or maintained) within a target range. The target range provides a range of distances between the top surface of the pockets 536 and a bottom surface of the gate structure 520 that will prevent current leakage and enhance the function of the stressed region. In the present embodiment, the distance between the top surface of the pockets 536 and a bottom surface of the gate dielectric layer 522 (i.e., a layer of the gate stack of gate structure 520) is controlled to prevent current leakage and enhance the stressed region functionality.

The pockets 536, essentially providing an abrupt junction between the source/drain region and substrate interface, may lead to significant improvement in SCEs and/or reduce current leakage. The increased control over the SCEs can allow continual semiconductor device scaling down. Further, in the present embodiment, the method 400 may reduce strain relaxation within the SiGe portions of the source/drain regions, which can improve the performance of semiconductor device 500. It is understood that the present embodiment may provide some, all, or none of the advantages described herein. It is further understood that different embodiments may have different advantages, and that no particular advantage is necessarily required of all embodiments.

Figure 5G:
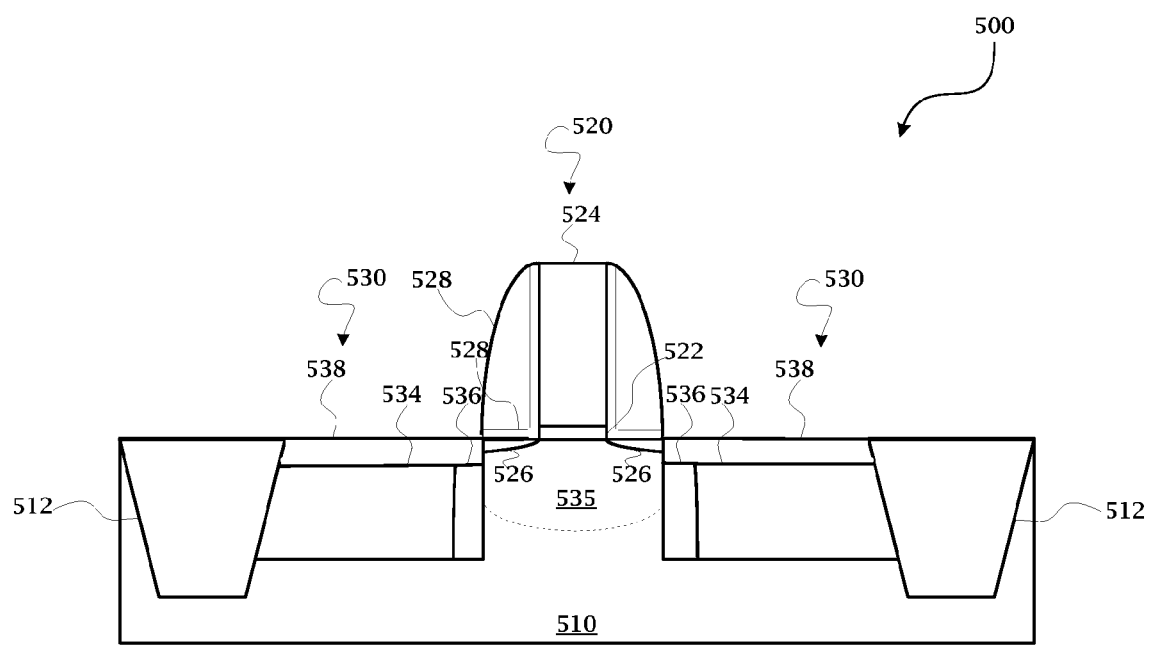

At step 416, a second layer is formed over the one or more recesses. Referring to FIG. 5G, a second layer 538 is formed to partially fill the recesses 530, specifically, the second layer 538 is formed over the first layer 534 and pockets 536 in the recesses 530. In some embodiments, the second layer 538 may be formed to entirely fill the recesses 530. In some embodiments, the second layer 538 may be formed to extend above a top surface of the recesses 530, forming a raised source/drain structure. The second layer 538 is formed by any suitable process. In the present embodiment, second layer 538 is formed by epitaxial growth. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 510 (e.g., silicon). The second layer 538 comprises any suitable material, such as epitaxially grown silicon, SiGe, SiC, and/or combinations thereof. In the present embodiment, the second layer 536 comprises epitaxial grown SiGe.

In the present embodiment, the epitaxial grown first layer 534 and second layer 538 may be in-situ doped or undoped during the epitaxial growth. For example, in the present embodiment, the first layer 534 comprises undoped epitaxial grown SiGe, and the second layer 538 comprises in-situ doped epitaxial grown SiGe. When the first and/or second layer 534, 538 is undoped, it is understood that the undoped layers may be doped subsequently. The undoped layers may be doped by one or more various implantation processes. The various implantation processes may comprise conventional ion implantation process, plasma immersion ion implantation (PIII) processes, gas and/or solid source diffusion processes, other suitable processes, and/or combinations thereof. The first and/or second layers 534, 538 may further be exposed to annealing processes, such as a rapid thermal annealing process. The various implantation and/or annealing processes may be performed at any suitable time during the fabrication of semiconductor device 500.

Figure 6A:
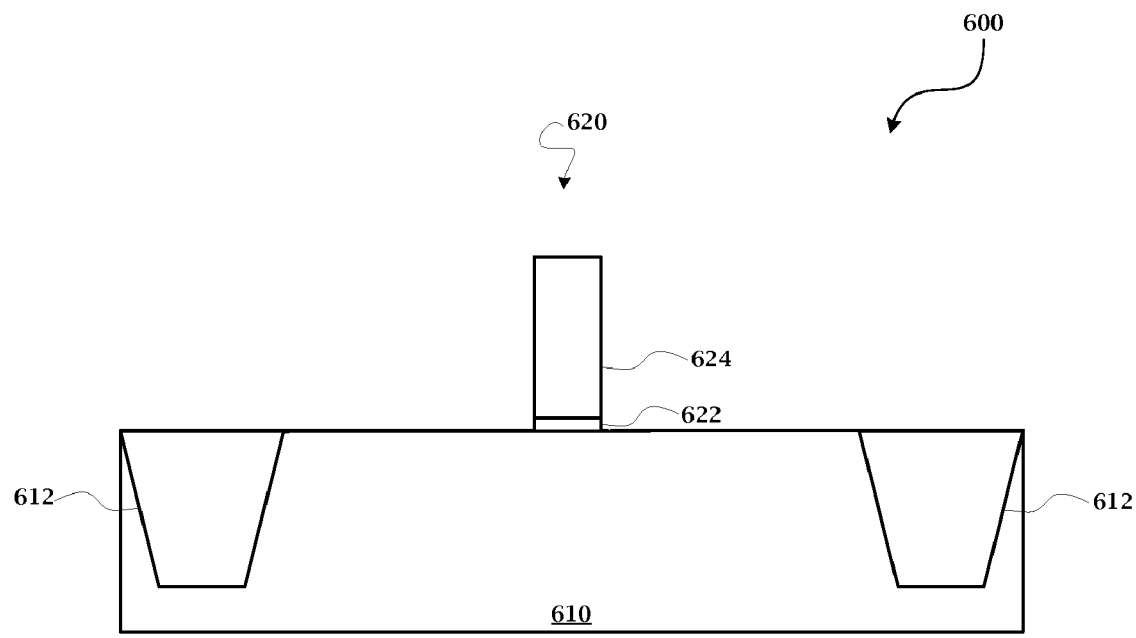
FIGS. 6A-6G are various cross-sectional views of embodiments of a semiconductor device during various fabrication stages according to the method of FIG. 4.

Referring to FIGS. 6A-6G provide various cross-sectional views of another embodiment of a semiconductor device 600 during various fabrication stages according to the method of FIG. 4. The semiconductor device 600 is similar to the semiconductor device 500. Referring to FIG. 6A, at step 402, a substrate 610 including one or more isolation regions 612 and at least one gate structure 620 is provided. The at least one gate structure 620 includes a gate stack (i.e., a gate dielectric layer 622 and gate layer 624). The substrate 610, isolation regions 612, and gate structure 620 including gate dielectric layer 622 and gate layer 624 may be similar to the substrate 510, isolation regions 512, and gate structure 520 including gate dielectric layer 522 and gate layer 524 described in FIG. 5A.

Figure 6B:
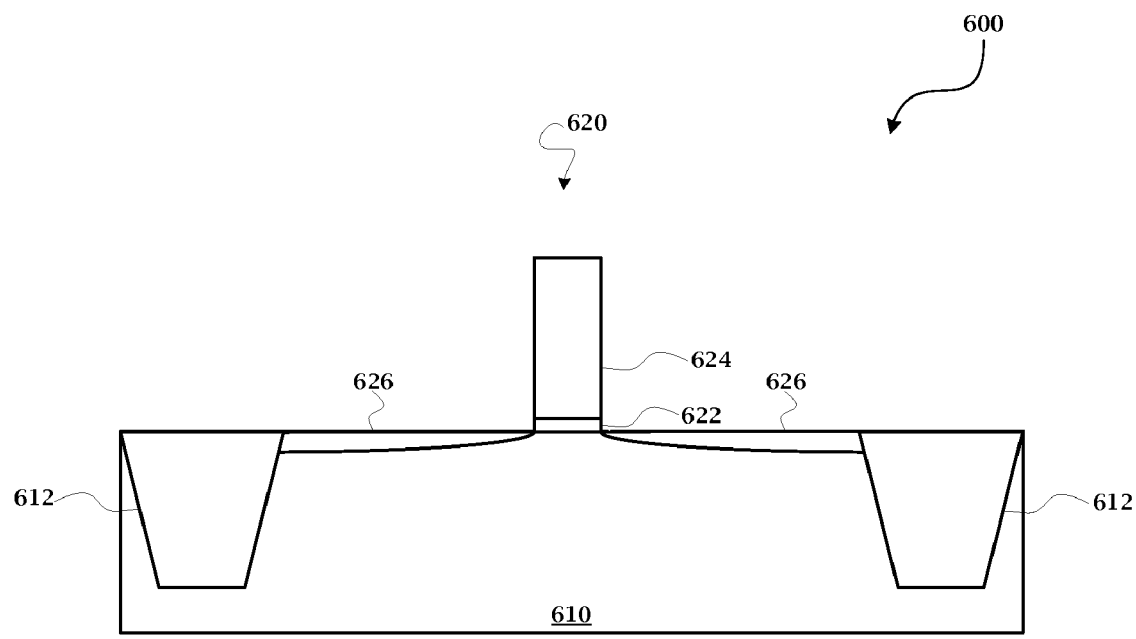
Figure 6C:
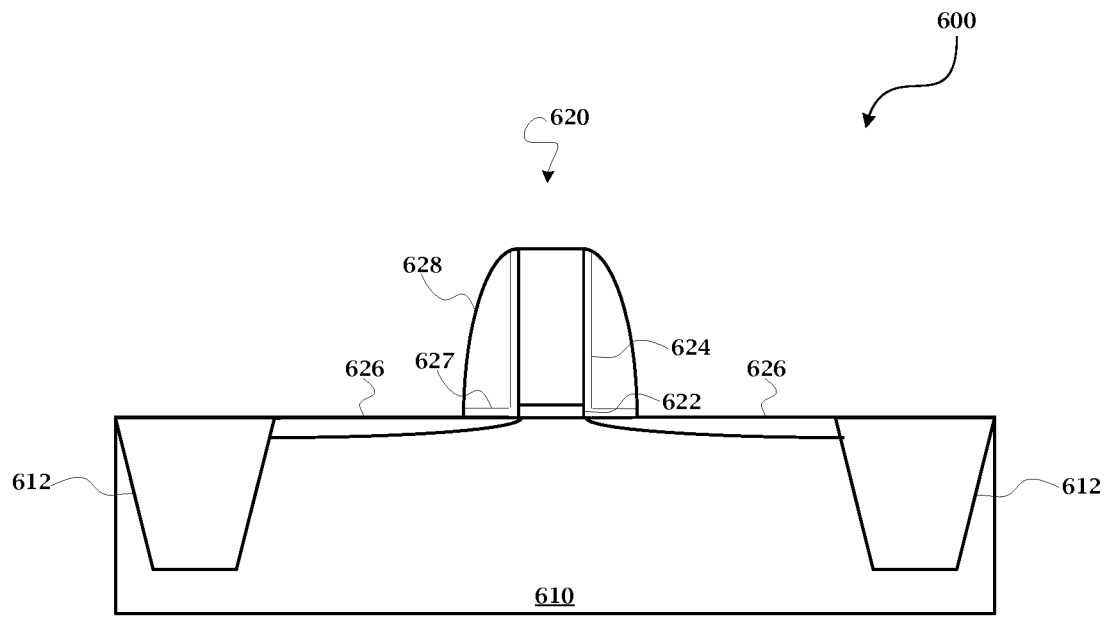

Referring to FIGS. 5 and 6B-6C, at step 404, various implantation processes are performed on the substrate 610, and at step 406, one or more gate spacers are formed over the substrate 610. In the present embodiment, referring to FIG. 6B, lightly doped drain (LDD) regions 626 are formed by one or more ion implantation processes, and gate spacer liners 627 and gate spacers 628 are positioned on each side of the gate stack (i.e., gate dielectric layer 622/gate layer 624) of the gate structure 620 (e.g., along the sidewalls of the gate dielectric layer 622 and gate layer 624 of the gate structure 620). The LDD regions 626, gate spacer liners 627, and gate spacers 628 are similar to the LDD regions 526, gate spacer liners 527, and gate spacers 528 discussed above with reference to FIGS. 5B-5C.

Referring to FIGS. 6D-6G, one or more source/drain regions are formed, wherein the source/drain regions comprise a pocket. At step 408, one or more trenches and/or recesses are formed in the substrate. The one or more recesses define a source region and a drain region (collectively referred to as source/drain region) for the semiconductor device 600.

Figure 6D:
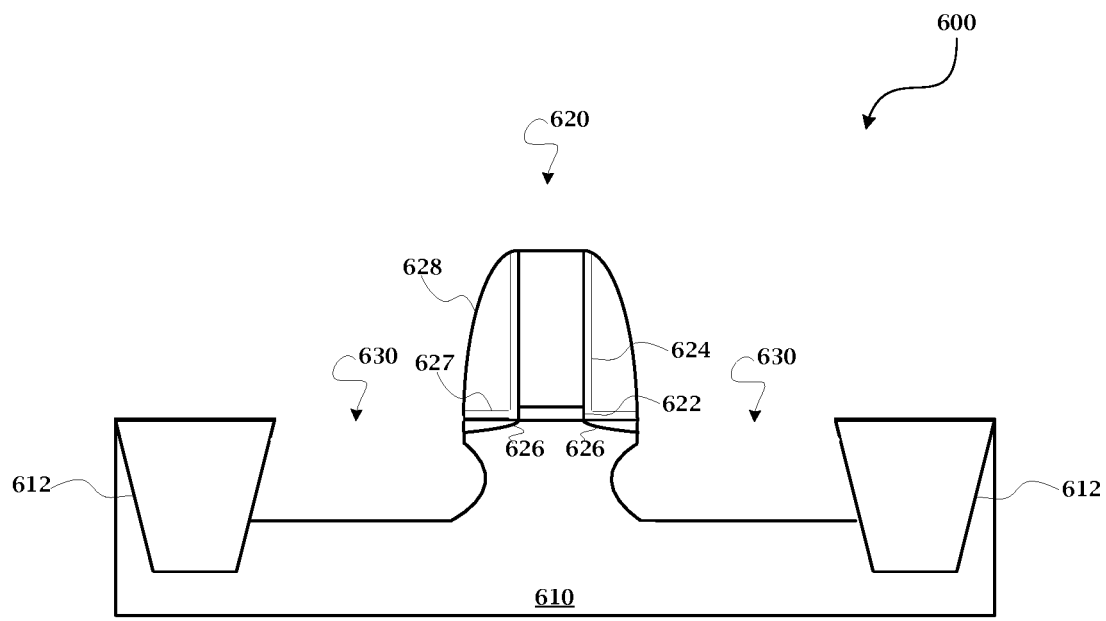

For example, as illustrated in FIG. 6D, one or more recesses 630 are formed on each side of the at least one gate structure 620. The recesses 630 may be formed by any suitable process and may be similar to the recesses 530 illustrated in FIG. 5D. In the present embodiment, the recesses 630 are isotropic recesses, formed by one or more isotropic etching processes. The isotropic etching process forms recesses 630 that extend under the gate structure 620, and specifically, in the present embodiment, under gate spacers 628 and LDD regions 626. It is understood that the isotropic recesses 630 may extend any distance below the gate structure 620. Further, the recesses 630 comprise any suitable profile. As shown in FIG. 6D, at least one of the vertical sidewalls of the recesses 630 comprises a curved profile.

Figure 6E:
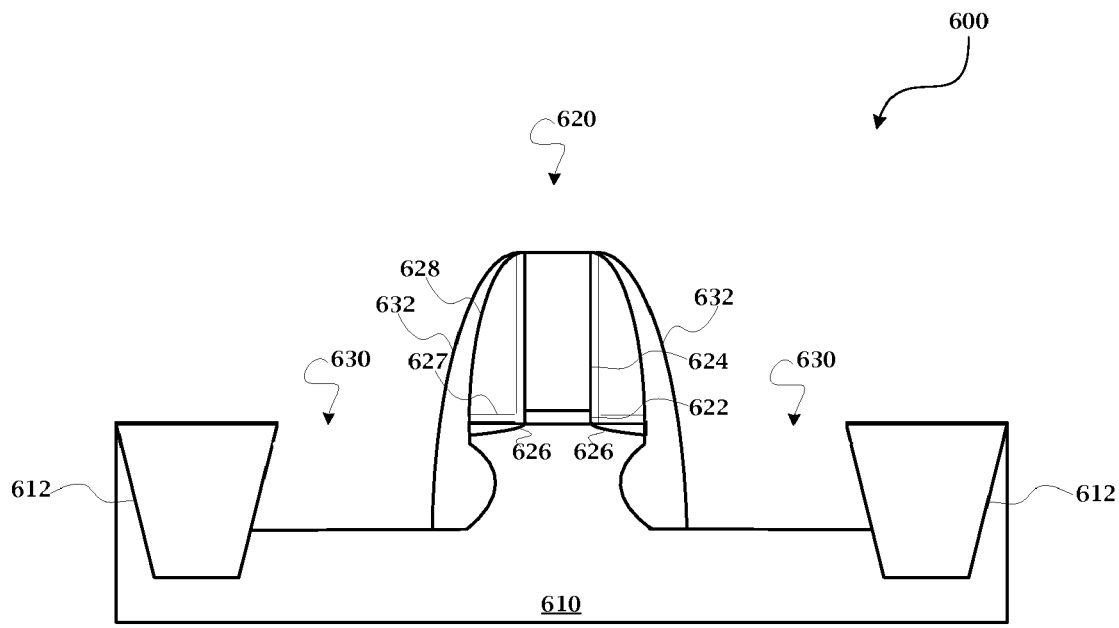
Figure 6F:
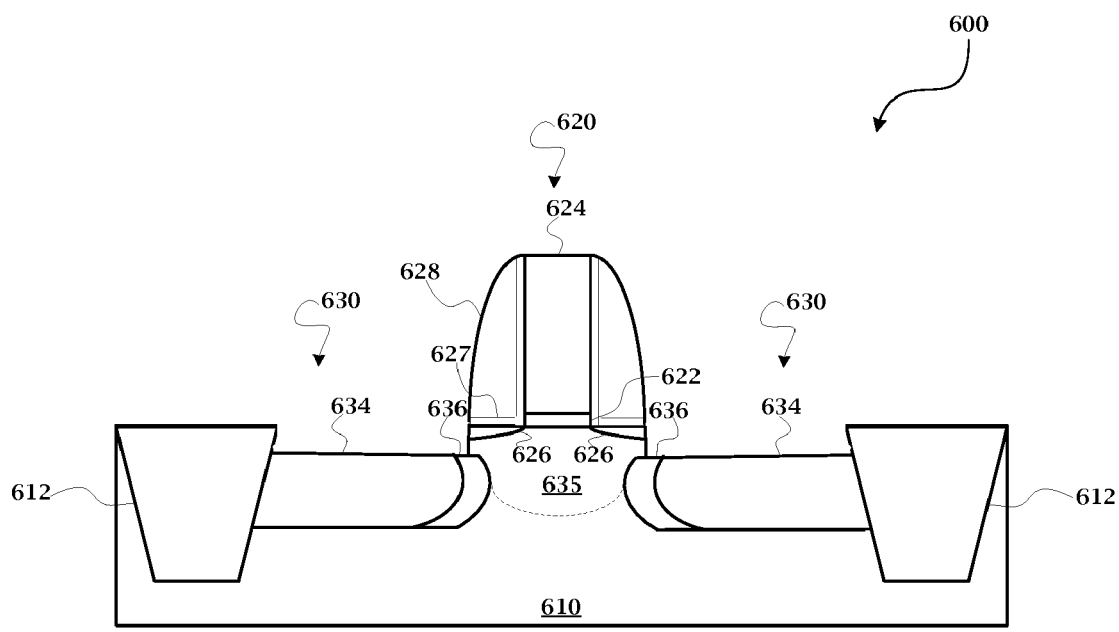

At step 410, a pocket layer is formed along the sides of the at least one gate structure and the sides of the one or more recesses. Referring to FIG. 6E, a pocket layer 632 is formed adjacent the gate spacers 628 and vertical, curved sidewalls of the recesses 630. Then, at step 412, a first layer is formed over the one or more recesses, wherein the first layer at least partially fills the one or more recesses. Referring to FIG. 6F, a first layer 634 is formed to partially fill the recesses 630. The pocket layer 632 and first layer 634 are similar to pocket layer 532 and first layer 534 illustrated in FIGS. 5E-5F. For example, the pocket layer 632 comprises a dielectric material, and the first layer 634 comprises epitaxially grown SiGe. The recesses 630 (that define the source/drain regions) comprising the first layer 634 (i.e., epitaxially grown SiGe) achieves a strained channel 635 in the substrate 610. The strained channel can increase carrier mobility and enhance the performance of the semiconductor device 600. It should be noted that, in the present embodiment, the isotropic recesses 630 increase the volume of the epitaxially grown SiGe within the recesses 630, particularly the volume of the first layer 634 within the recesses 630. The isotropic recesses 630 having the first layer 634 can result in an increased strained channel effect in the substrate 610, contributing to enhanced performance of the semiconductor device 600.

Referring again to FIG. 6F, at step 414, the pocket layer is removed from the sides of the at least one gate structure. More particularly, the pocket layer 632 is removed from each side of the gate structure 620. In the present embodiment, the pocket layer 634 is also partially removed within the recess 630. The pocket layer 632 is removed within the recesses 630 wherein a top surface of the pocket layer 632 is substantially coplanar with a top surface of the first layer 634. The pocket layer 632 may be removed by any suitable process, including the processes described herein, such as the processes described with reference to FIG. 5F and removal of the pocket layer 532. The remaining pocket layer 632 forms pockets 636 within the recesses 630 (that define the source/drain region). The pockets 636 are disposed between the interface of the first layer 634 (i.e., epitaxially grown SiGe portions of the source/drain regions) and the substrate 610 (i.e., silicon substrate). Thus, the source/drain regions comprise pockets 636 (in the present embodiment, a dielectric pocket).

As noted above, the top surface of the first layer 634 is substantially coplanar with a top surface of the pockets 636. It should also be noted that the distance between the top surface of the pockets 636 and a bottom surface of the gate structure 620, for example, a gate stack of the gate structure, is controlled (or maintained) within a target range. The target range provides a range of distances between the top surface of the pockets 636 and a bottom surface of the gate structure 620 that will prevent current leakage and enhance the function of the stressed region. In the present embodiment, the distance between the top surface of the pockets 636 and a bottom surface of the gate dielectric layer 622 (i.e., a layer of the gate stack of gate structure 620) is controlled to prevent current leakage and enhance the stressed region functionality.

The pockets 636, essentially providing an abrupt junction between the source/drain region and substrate interface, may lead to significant improvement in SCEs and/or reduce current leakage. The increased control over the SCEs can allow continual semiconductor device scaling down. Further, in the present embodiment, the method 400 may reduce strain relaxation within the SiGe portions of the source/drain regions, which can improve the performance of semiconductor device 600. It is understood that the present embodiment may provide some, all, or none of the advantages described herein. It is further understood that different embodiments may have different advantages, and that no particular advantage is necessarily required of all embodiments.

Figure 6G:
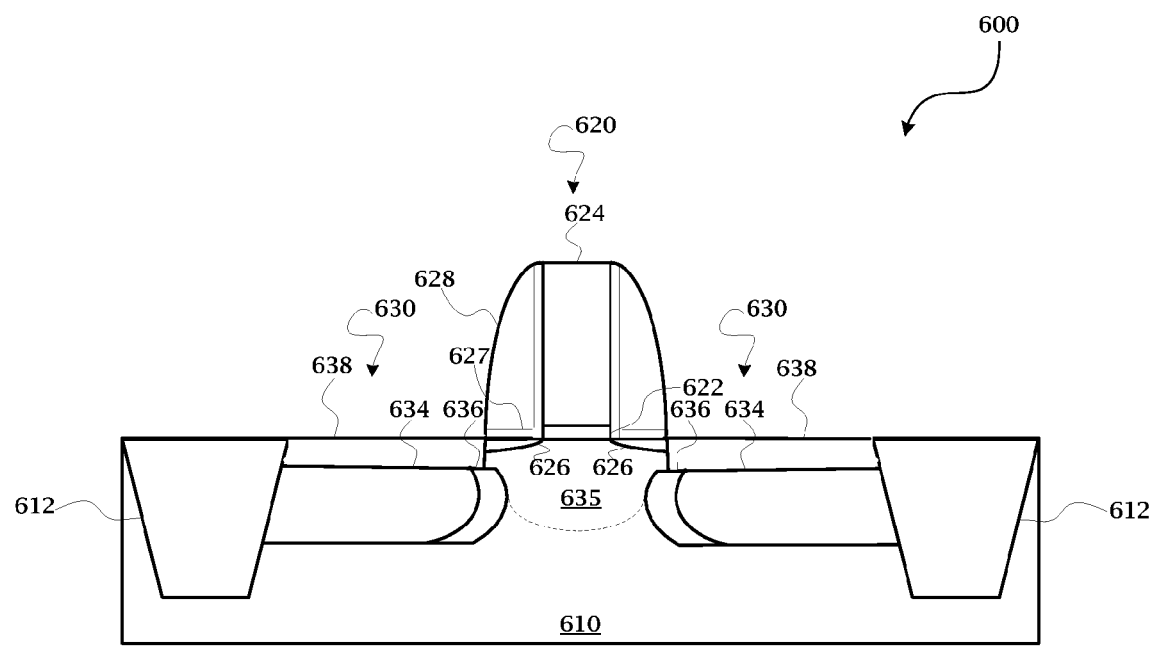

At step 416, a second layer is formed over the one or more recesses. Referring to FIG. 6G, a second layer 638 is formed to partially fill the recesses 630, specifically, the second layer 638 is formed over the first layer 634 and pockets 636 in the recesses 630. In some embodiments, the second layer 538 may be formed to entirely fill the recesses 530. In some embodiments, the second layer 538 may be formed to extend above a top surface of the recesses 530, forming a raised source/drain structure. The second layer 638 is similar to the second layer 538 described with reference to FIG. 5G, and in the present embodiment, the second layer 638 comprises epitaxial grown SiGe.

The semiconductor devices 500, 600 comprise pockets 536, 636 that provide an abrupt junction between the source/drain region and substrate interface, which may allow better control of SCEs. Further, the method 400 may not subject the deep source/drain regions of the semiconductor devices 500, 600 to the one or more ion implantation processes, such as those that form LDD regions and/or pocket implantation regions. It is understood that the semiconductor devices 500, 600 may undergo further CMOS or MOS technology processing to form various features known in the art. For example, in some embodiments, the source/drain regions may be exposed to an implantation process to form deep source/drain regions. In some embodiments, source/drain regions comprising first layer 534, 634, pockets 536, 636, and second layer 538, 538 and/or gate structure 520, 620 may comprise silicide regions having any suitable composition. In still another example, various contacts/vias and multilayer interconnect features (e.g., metal layers and interlayer dielectrics) may be formed on the substrates 510, 610 and configured to connect the various features or structures of the semiconductor devices 500, 600.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for fabricating a semiconductor device, the method comprising:
   providing a substrate comprising a first material;
   forming at least one gate stack over the substrate;

forming one or more recesses in the substrate, wherein the one or more recesses define at least one source region and at least one drain region; and forming a pocket, a first layer comprising a second material, and a second layer comprising a third material in the one or more recesses, the pocket being disposed between the first layer and the substrate and the first layer in physical contact with the substrate.

2. The method of claim 1 wherein forming the pocket and the first layer comprises forming a top surface of the pocket substantially coplanar with a top surface of the first layer.

3. The method of claim 1 wherein forming the pocket comprises controlling a distance between a top surface of the pocket and a bottom surface of the gate stack.

4. The method of claim 1 wherein forming the pocket, the first layer comprising a second material, and the second layer comprising a third material in the one or more recesses comprises:

forming a first set of spacers adjacent the at least one gate stack;

forming a pocket layer over the first set of spacers and a side of the one or more recesses in the substrate;

forming the first layer over the substrate to partially fill the one or more recesses;

removing the pocket layer from over the first set of spacers, wherein the remaining pocket layer forms the pocket in the one or more recesses and a top surface of the pocket is substantially coplanar with a top surface of the first layer;

removing the first set of spacers including a portion of the substrate lying underneath the first set of spacers, wherein the removed portion of the substrate forms an extension to the one or more recesses;

forming the second layer over the first layer in the one or more recesses to fill the one or more recesses, including the extension to the one or more recesses; and forming a second set of spacers adjacent the at least one gate stack.

5. The method of claim 4 wherein forming the first layer and forming the second layer each comprises performing a selective epitaxy growth process.

6. The method of claim 4 wherein removing the pocket layer from over the first set of spacers and removing the first set of spacers adjacent the at least one gate stack each comprises performing a wet etching process.

7. The method of claim 1 wherein the first material comprises silicon and the second and third materials comprise silicon germanium.

8. The method of claim 7 wherein the third material is in-situ doped.

9. The method of claim 1 wherein the pocket comprises a dielectric material including at least one of silicon oxide, silicon oxynitride, or silicon nitride.

10. The method of claim 1 wherein the pocket comprises a thickness between about 50 Å and 200 Å.

11. A method for fabricating an semiconductor device, the method comprising:

providing a substrate having at least one gate stack disposed thereover;

performing one or more implantation processes on the substrate;

forming a set of spacers adjacent the at least one gate stack;

forming one or more recesses in the substrate, wherein the one or more recesses define at least one source region and at least one drain region;

forming a pocket in the one or more recesses, wherein the pocket is substantially aligned with the spacer;

forming a first layer to partially fill the one or more recesses, wherein the first layer is adjacent the pocket in the one or more recesses; and forming a second layer over the first layer and the pocket in the one or more recesses.

12. The method of claim 11 wherein performing the one or more implantation processes on the substrate comprises forming lightly doped drain regions, pocket implantation regions, or combinations thereof.

13. The method of claim 11 wherein forming the pocket and the first layer comprises forming a top surface of the pocket substantially coplanar with a top surface of the first layer.

14. The method of claim 11 wherein forming the pocket comprises controlling a distance between a top surface of the pocket and a bottom surface of the gate stack.

15. The method of claim 11 wherein forming the pocket in the one or more recesses comprises:

prior to forming the first layer to partially fill the one or more recesses, depositing a dielectric layer over the set of spacers adjacent the at least one gate stack and a side of the one or more recesses;

after forming the first layer to partially fill the one or more recesses, removing the dielectric layer from over the set of spacers adjacent the at least one gate stack; and removing a portion of the dielectric layer from the one or more recesses such that a top surface of the first layer and the dielectric layer in the one or more recesses are substantially coplanar.

16. The method of claim 11 wherein forming the first layer and forming the second layer each comprises performing a selective epitaxy growth process.

17. The method of claim 11 wherein the substrate comprises silicon and the first layer and the second layer comprise silicon germanium.

18. A method for fabricating a semiconductor device, the method comprising:

providing a substrate having at least one gate structure disposed thereover;

forming one or more recesses in the substrate, wherein the one or more recesses define at least one source region and at least one drain region;

forming a pocket in the one or more recesses, the pocket having an upper surface;

forming a first layer adjacent to the pocket in the one or more recesses such that the pocket is disposed between the first layer and the substrate, the first layer in physical contact with the substrate and having an upper surface; and forming a second layer on the upper surface of the first layer and on the upper surface of the pocket in the one or more recesses.

19. The method of claim 18, wherein the upper surface of the first layer is substantially coplanar with the upper surface of the pocket.

20. The method of claim 18, wherein the at least one gate structure includes opposing sidewall spacers, the method further comprising:

removing the opposing sidewall spacers prior to forming the second layer on the upper surface of the first layer and on the upper surface of the pocket in the one or more recesses.

21. The method of claim 1 wherein forming the pocket, the first layer comprising the second material, and the second layer comprising the third material in the one or more recesses includes removing a portion of the substrate under a spacer associated with the at least one gate stack prior to forming the second layer comprising the third material.

* * * * *